US012593438B2

(12) United States Patent
Kim et al.

(10) Patent No.: US 12,593,438 B2
(45) Date of Patent: Mar. 31, 2026

(54) SEMICONDUCTOR MEMORY DEVICES

(71) Applicant: Samsung Electronics Co., Ltd., Suwon-si (KR)

(72) Inventors: Yangdoo Kim, Seoul (KR); Yonghwan Kim, Hwaseong-si (KR); Sangwuk Park, Hwaseong-si (KR); Sunghyun Park, Hwaseong-si (KR); Jinyoung Park, Suwon-si (KR); Minkyu Suh, Yongin-si (KR); Jungpyo Hong, Gwangmyeong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 615 days.

(21) Appl. No.: 17/945,235

(22) Filed: Sep. 15, 2022

(65) Prior Publication Data

US 2023/0200053 A1 Jun. 22, 2023

(30) Foreign Application Priority Data

Dec. 21, 2021 (KR) ........................ 10-2021-0184285

(51) Int. Cl.
*H10B 12/00* (2023.01)

(52) U.S. Cl.
CPC ......... *H10B 12/315* (2023.02); *H10B 12/033* (2023.02); *H10B 12/34* (2023.02); *H10B 12/36* (2023.02)

(58) Field of Classification Search
CPC .. H10B 12/03; H10B 12/033; H10B 12/0335; H10B 12/315
See application file for complete search history.

(56) References Cited

U.S. PATENT DOCUMENTS

| 8,815,697 B2 | 8/2014 | Yoon et al. |
| 8,993,396 B2 | 3/2015 | Park et al. |
| (Continued) | | |

FOREIGN PATENT DOCUMENTS

| KR | 100487915 B1 | 8/2005 |
| KR | 1020120056074 A | 6/2012 |
| (Continued) | | |

OTHER PUBLICATIONS

First Office Action dated Oct. 31, 2023 from the Taiwan Intellectual Property Office for corresponding Taiwanese Patent Application No. 111147176.

*Primary Examiner* — Zandra V Smith
*Assistant Examiner* — Molly K Reida
(74) *Attorney, Agent, or Firm* — Muir Patent Law, PLLC

(57) ABSTRACT

A semiconductor memory device includes a substrate including a memory cell region, a plurality of capacitor structures arranged in the memory cell region of the substrate and including a plurality of lower electrodes, a capacitor dielectric layer, and an upper electrode, a first support pattern contacting sidewalls of the plurality of lower electrodes of the plurality of capacitor structures to support the plurality of lower electrodes, and a second support pattern located at a higher vertical level than a vertical level of the first support pattern and contacting the sidewalls of the plurality of lower electrodes to support the plurality of lower electrodes. The plurality of lower electrodes have a plurality of recessed electrode portions, respectively, in upper portions of the plurality of lower electrodes.

18 Claims, 30 Drawing Sheets

(56)     References Cited

U.S. PATENT DOCUMENTS

| | | | |
|---|---|---|---|
| 9,240,441 B2 | 1/2016 | Yoon et al. | |
| 9,806,081 B2 | 10/2017 | Yim | |
| 10,319,805 B2 | 6/2019 | Yoon et al. | |
| 2012/0125879 A1 | 5/2012 | Park et al. | |
| 2020/0303492 A1 | 9/2020 | Kim et al. | |
| 2021/0188705 A1* | 6/2021 | Hamakubo | ............. C03C 25/42 |
| 2021/0202490 A1* | 7/2021 | Cho | ..................... H10B 12/033 |
| 2021/0313329 A1 | 10/2021 | Han et al. | |
| 2022/0238532 A1* | 7/2022 | Shreeram | ............... H10B 12/31 |

FOREIGN PATENT DOCUMENTS

| | | | |
|---|---|---|---|
| KR | 1020210061162 A | 5/2021 | |
| KR | 1020210085699 A | 7/2021 | |

\* cited by examiner

SEMICONDUCTOR MEMORY DEVICES

CROSS-REFERENCE TO RELATED APPLICATION

This application is based on and claims priority under 35 U.S.C. § 119 to Korean Patent Application No. 10-2021-0184285, filed on Dec. 21, 2021, in the Korean Intellectual Property Office, the disclosure of which is incorporated by reference herein in its entirety.

BACKGROUND

The inventive concept relates to a semiconductor memory device, and more particularly, to a semiconductor memory device including a capacitor structure.

Electronic devices have been reduced in sizes and weights according to the rapid development of the electronics industry and the needs of users. As semiconductor memory devices used in electronic devices are manufactured in a high degree of integration, design rules for components of the semiconductor memory devices have been reduced to achieve such a high degree of integration. However, semiconductor memory devices having capacitor structures are desirable to secure an increase in capacity of capacitors along with the high degree of integration.

SUMMARY

The inventive concept provides a semiconductor memory device that may increase capacity of a capacitor.

According to an aspect of the inventive concept, a semiconductor memory device includes a substrate including a memory cell region, a plurality of capacitor structures arranged in the memory cell region of the substrate and including a plurality of lower electrodes, a capacitor dielectric layer, and an upper electrode, a first support pattern contacting sidewalls of the plurality of lower electrodes of the plurality of capacitor structures to support the plurality of lower electrodes, and a second support pattern located at a higher vertical level than a vertical level of the first support pattern and contacting the sidewalls of the plurality of lower electrodes to support the plurality of lower electrodes. The plurality of lower electrodes have a plurality of recessed electrode portions, respectively, in upper portions of the plurality of lower electrodes.

According to an aspect of the inventive concept, a semiconductor memory device includes a substrate having a memory cell region, a plurality of capacitor structures arranged in the memory cell region of the substrate and including a plurality of lower electrodes, an upper electrode, and a capacitor dielectric layer between each of the plurality of lower electrodes and the upper electrode, a first support pattern contacting sidewalls of the plurality of lower electrodes of the plurality of capacitor structures to support the plurality of lower electrodes, and a second support pattern contacting the sidewalls of the plurality of lower electrodes to support the plurality of lower electrodes. The second support pattern is located over the first support pattern, and located at a vertical level that is lower than uppermost ends of the plurality of lower electrodes and higher than middles of the plurality of lower electrodes in a vertical direction. Each of the plurality of lower electrodes includes a recessed electrode portion protruding upward from an upper surface of the second support pattern.

According to an aspect of the inventive concept, a semiconductor memory device includes a substrate including a plurality of active regions arranged in a memory cell region, a plurality of buried contacts connected to the plurality of active regions, a plurality of landing pads arranged on the plurality of buried contacts, a plurality of capacitor structures arranged in the memory cell region of the substrate and including a plurality of lower electrodes electrically connected to the plurality of landing pads, an upper electrode, and a capacitor dielectric layer located between each of the plurality of lower electrodes and the upper electrode, a first support pattern contacting sidewalls of the plurality of lower electrodes of the plurality of capacitor structures to support the plurality of lower electrodes, a second support pattern contacting the sidewalls of the plurality of lower electrodes to support the plurality of lower electrodes, the second support pattern being located over the first support pattern, and located at a vertical level that is lower than uppermost ends of the plurality of lower electrodes and higher than middles of the plurality of lower electrodes in a vertical direction, and a third support pattern contacting the sidewalls of the plurality of lower electrodes and being located over the second support pattern. Each of the plurality of lower electrodes has a recessed electrode portion located between an upper surface of the second support pattern and a lower surface of the third support pattern. The upper electrode includes an electrode protrusion extending toward the recessed electrode portion of each of the plurality of lower electrodes.

BRIEF DESCRIPTION OF THE DRAWINGS

Embodiments of the inventive concept will be more clearly understood from the following detailed description taken in conjunction with the accompanying drawings in which:

FIG. 1 is a block diagram illustrating a semiconductor memory device according to an embodiment of the inventive concept;

DETAILED DESCRIPTION OF THE EMBODIMENTS

Figure 1:
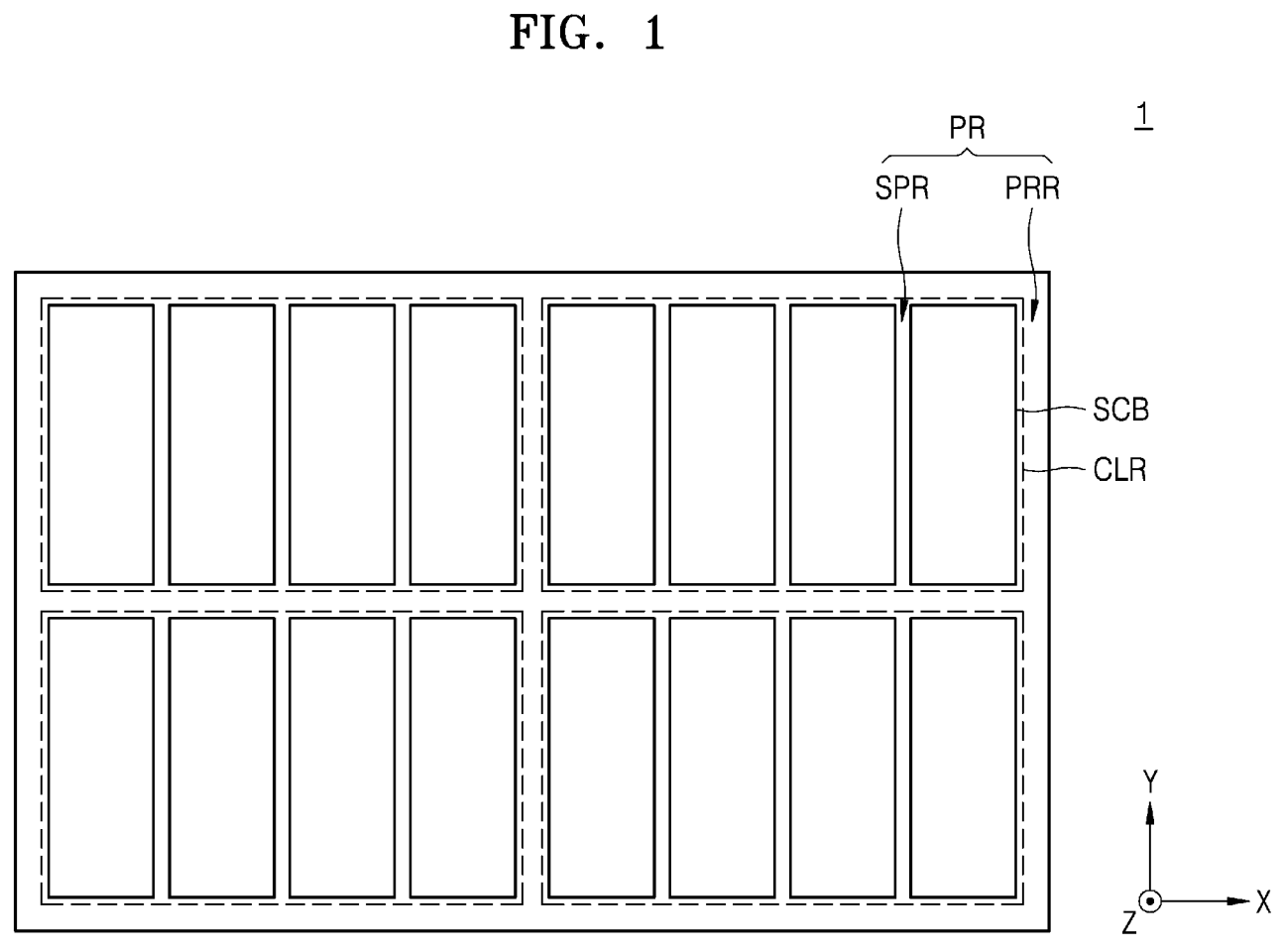

FIG. 1 is a block diagram illustrating a semiconductor memory device according to an embodiment of the inventive concept.

Referring to FIG. 1, a semiconductor memory device 1 may include a cell region CLR in which memory cells are arranged and a main peripheral region PRR surrounding the cell region CLR.

According to an embodiment of the inventive concept, the cell region CLR may include sub-peripheral regions SPR partitioning cell blocks SCB. The cell blocks SCB may each include a plurality of memory cells. In the present specification, the cell blocks SCB refer to regions in which the plurality of memory cells are regularly arranged with a uniform space, and the cell blocks SCB may be referred to as sub-cell blocks.

Logic cells for inputting and outputting electrical signals to and from the plurality of memory cells may be arranged in the main peripheral region PRR and the sub-peripheral regions SPR. In some embodiments, the main peripheral region PRR may be referred to as a peripheral circuit region, and the sub-peripheral region SPR may be referred to as a core circuit region. A peripheral region PR may include the main peripheral region PRR and the sub-peripheral regions SPR. In some embodiments, the peripheral region PR may include a core/peripheral circuit region including a peripheral circuit region and a core circuit region. In some embodiments, at least some of the sub-peripheral regions SPR may be provided only as spaces for partitioning the cell blocks SCB.

Figure 2:
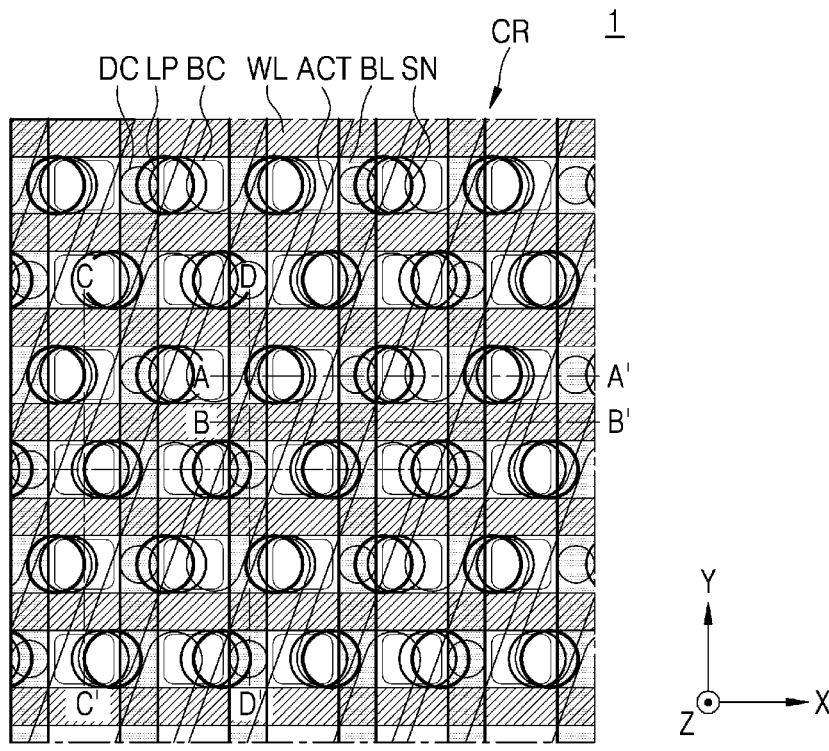
FIG. 2 is a layout diagram illustrating a semiconductor memory device according to an embodiment of the inventive concept.
Figure 7A:
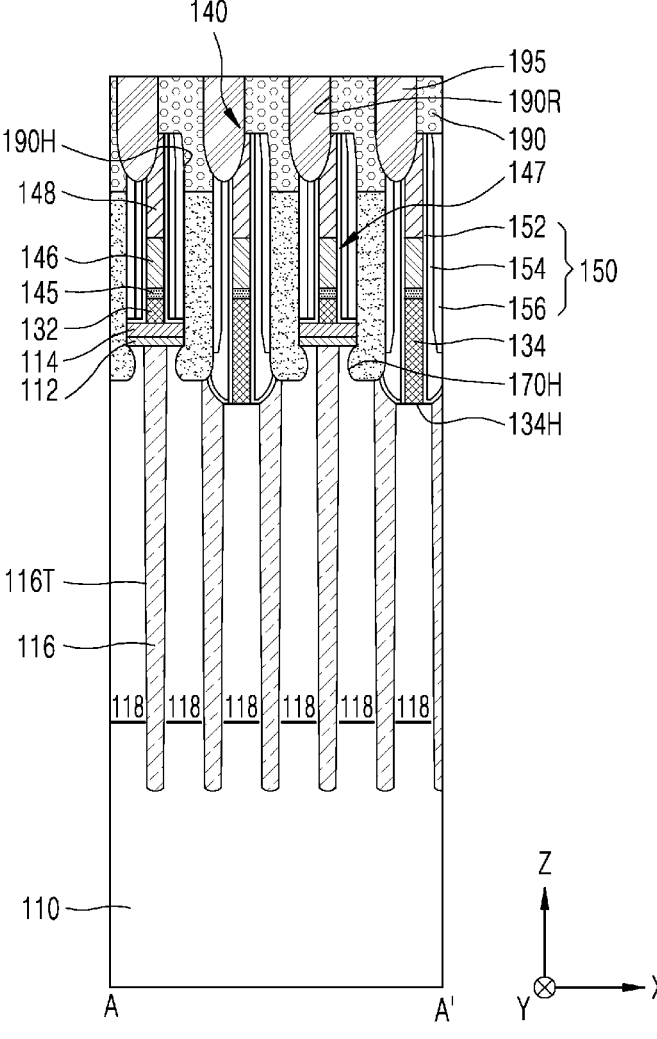
Figure 7B:
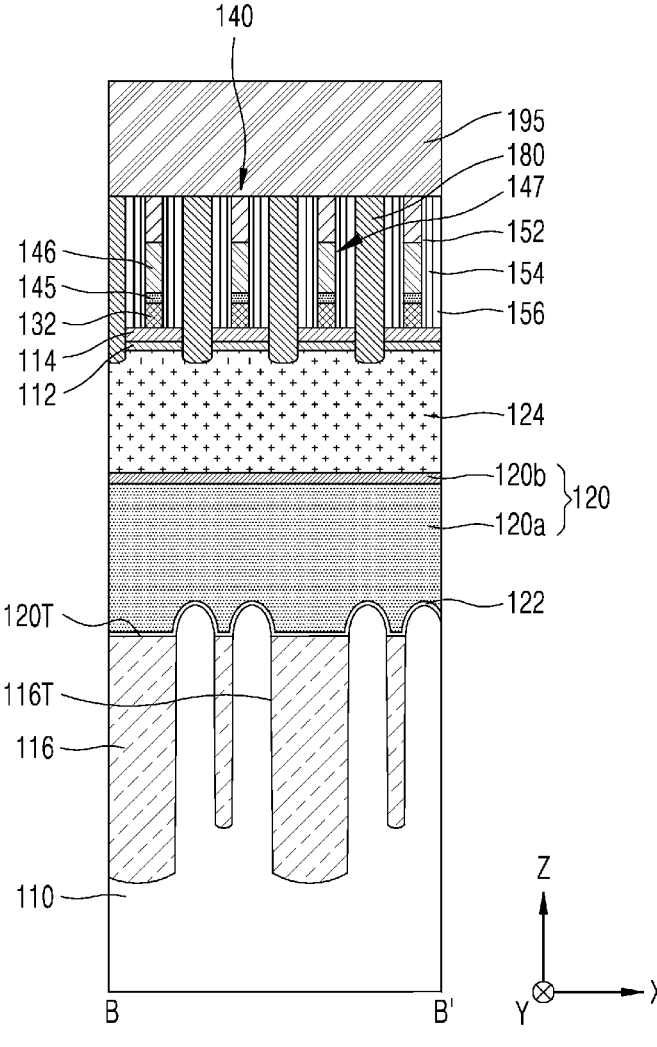
Figure 7C:
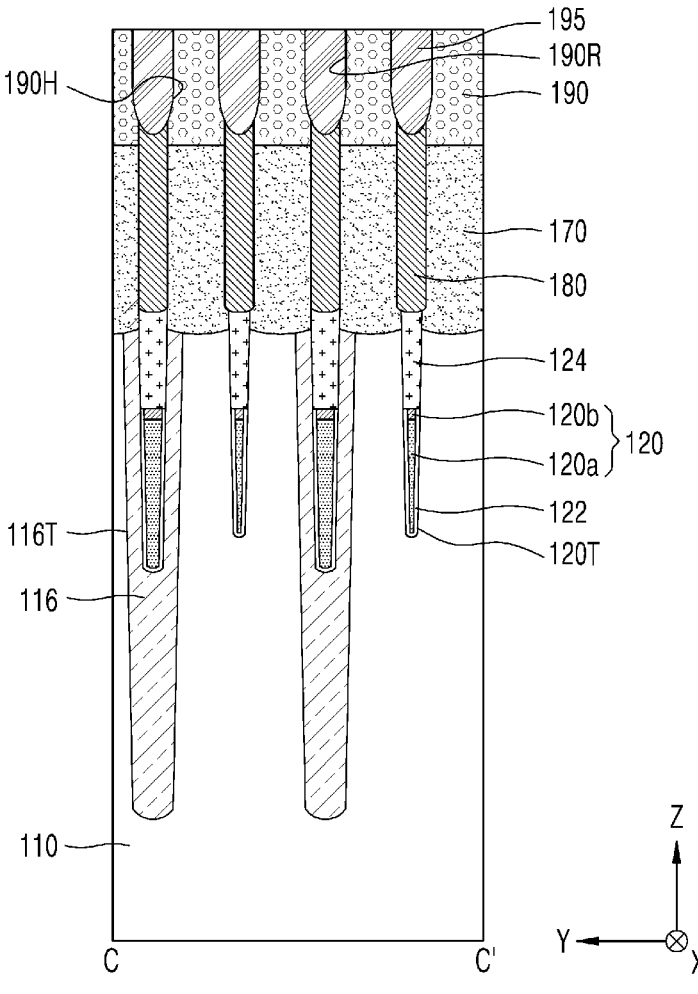
Figure 7D:
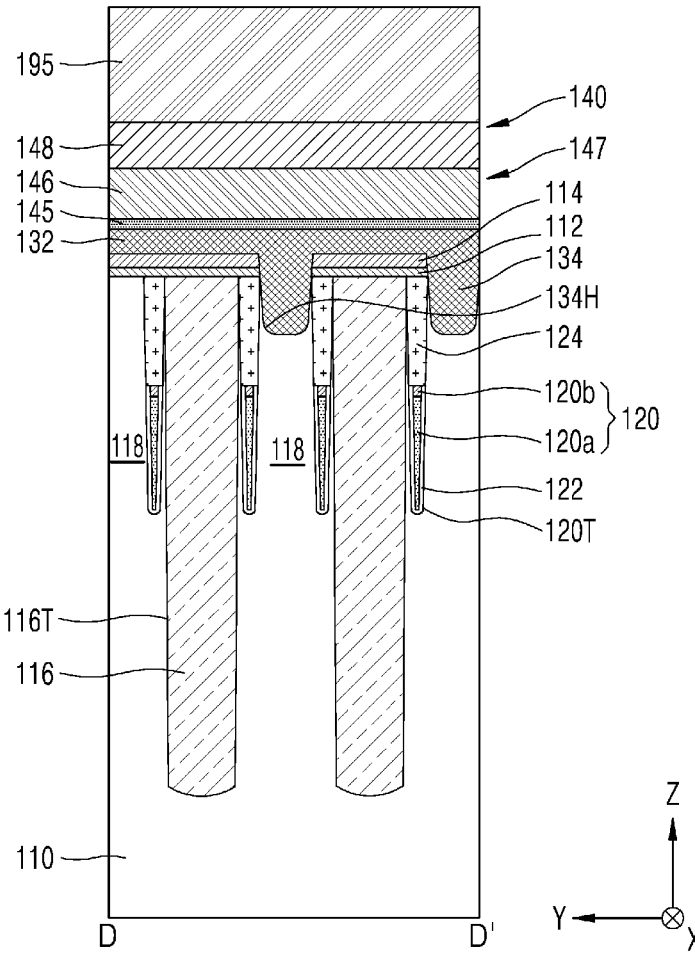
Figure 8A:
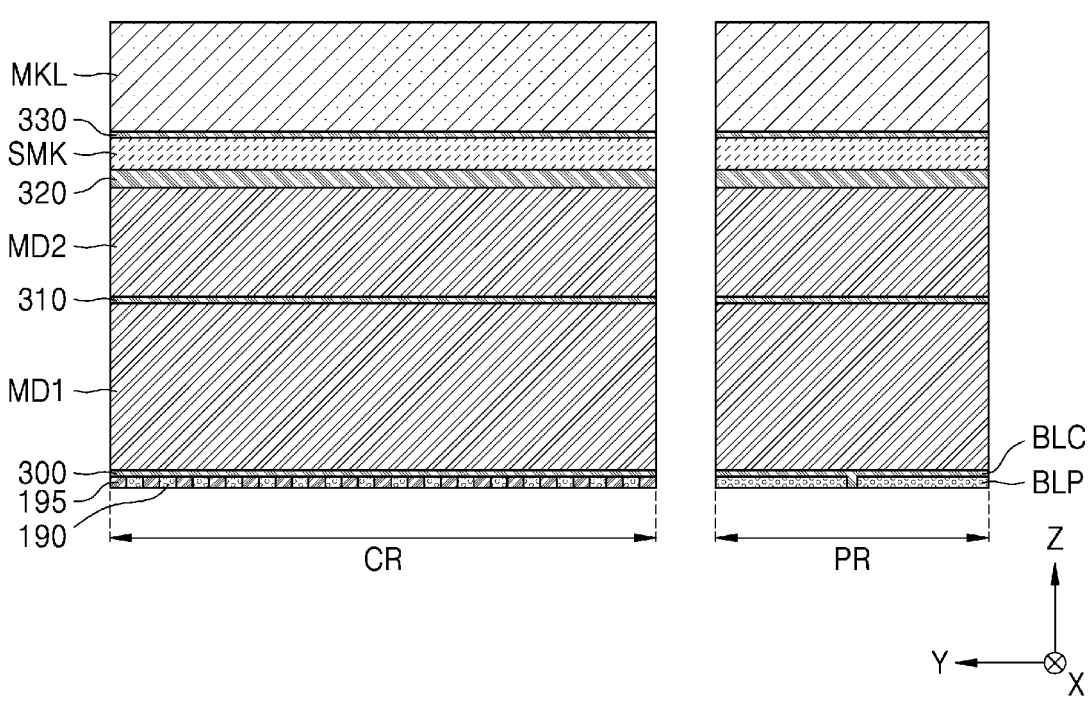
Figure 8B:
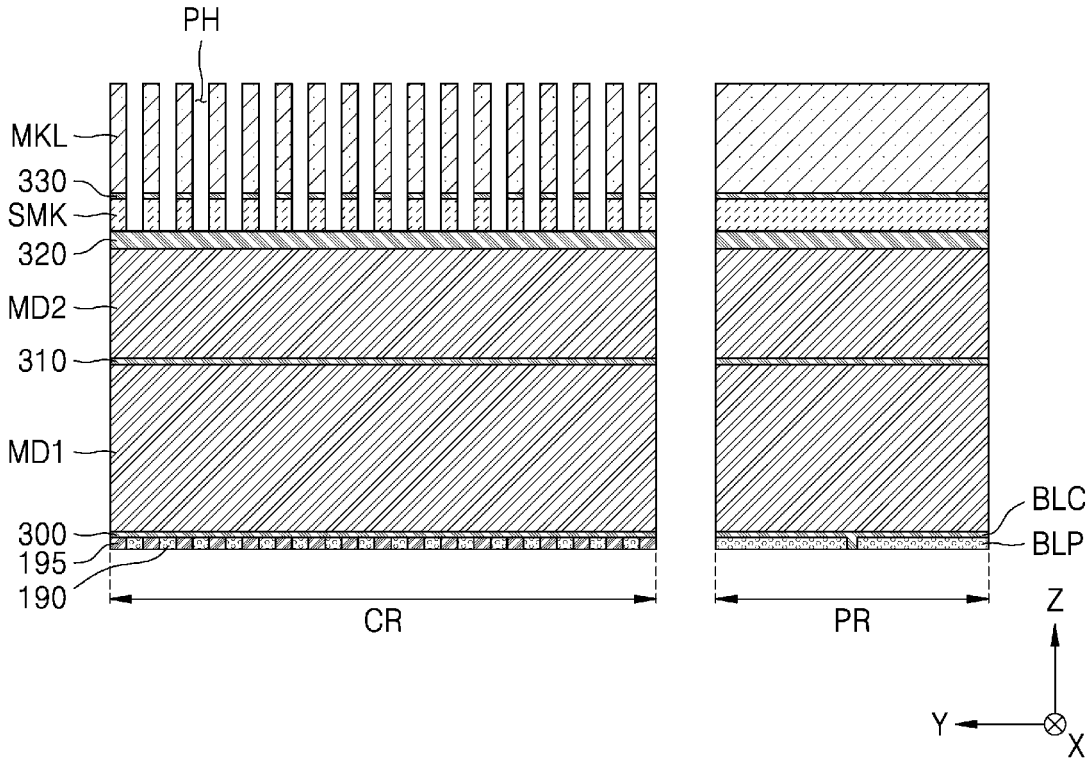
Figures 8C, 8D:
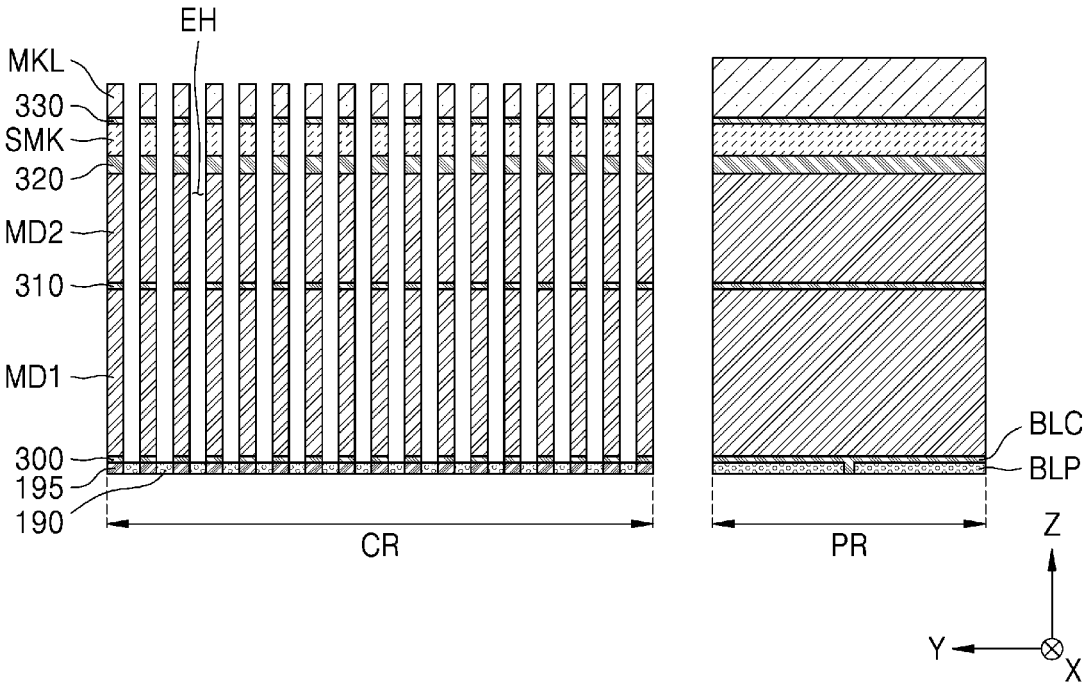
Figure 8E:
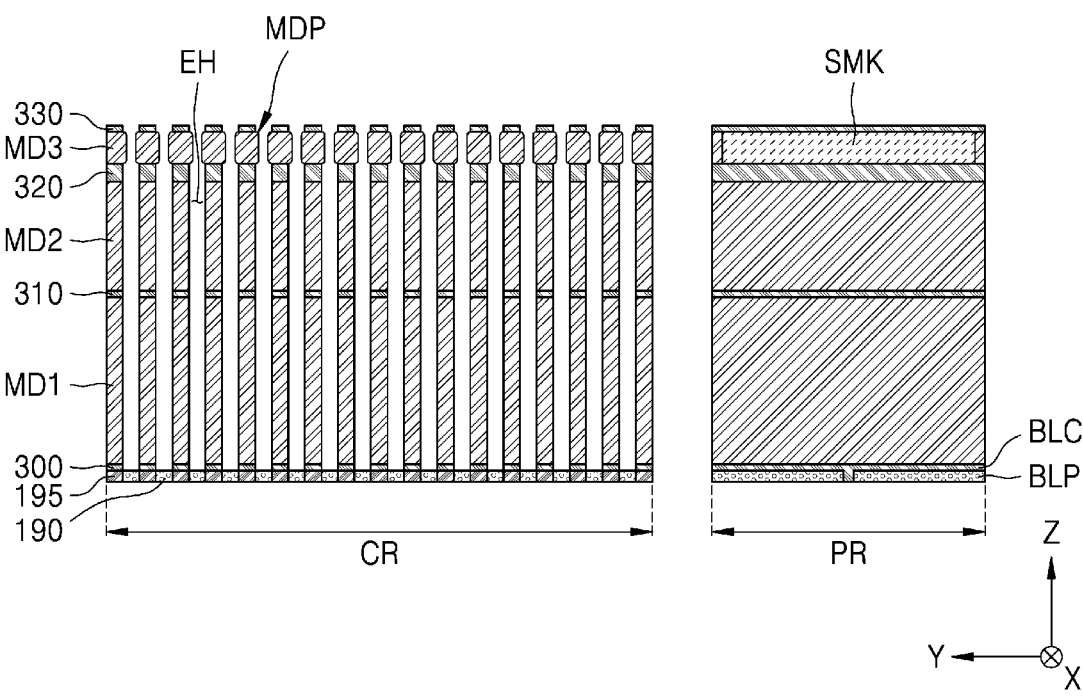
Figure 8F:
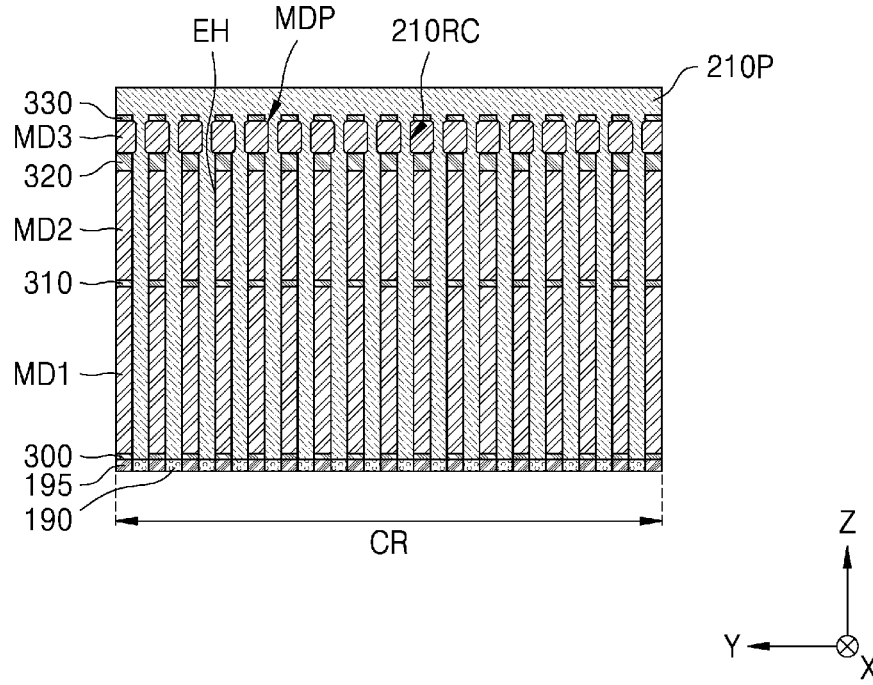
Figure 8G:
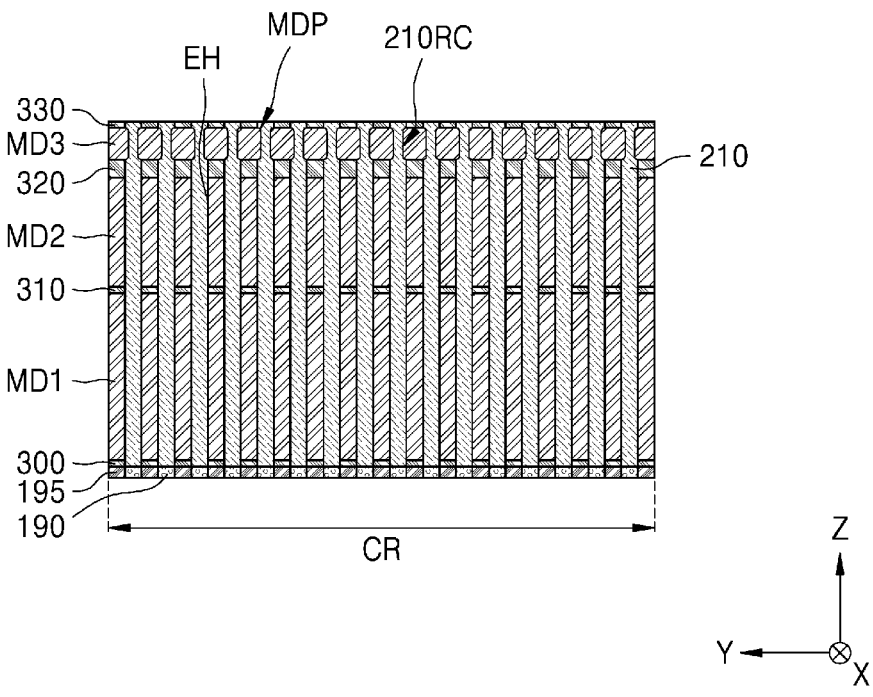
Figure 8H:
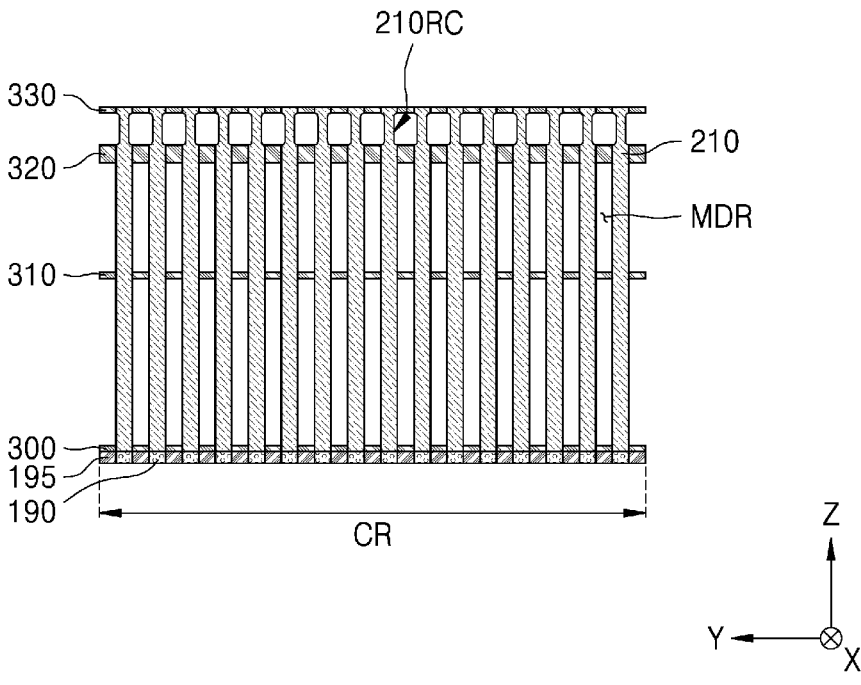
Figure 8I:
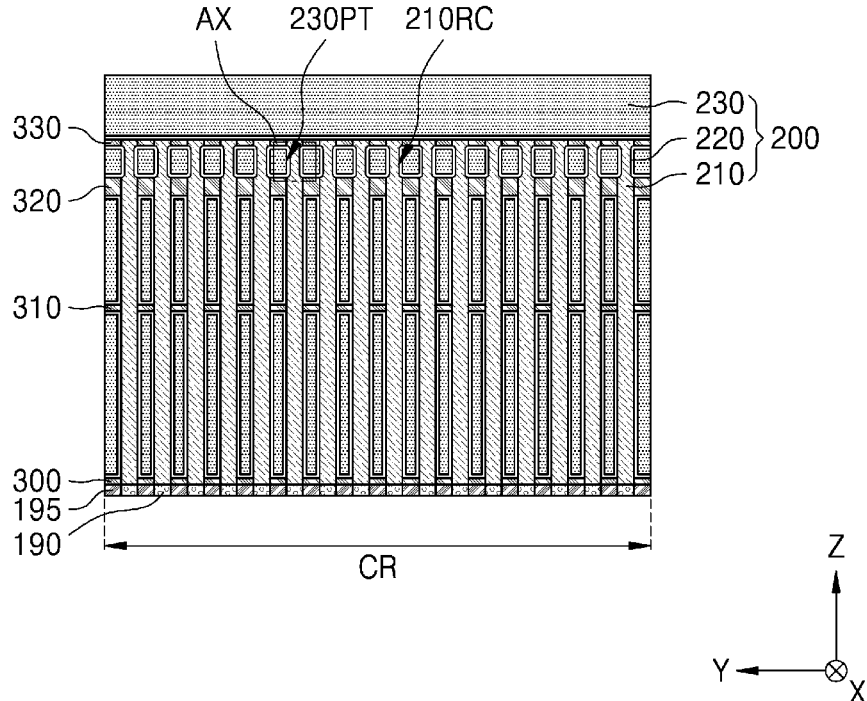
Figures 9A, 9B:
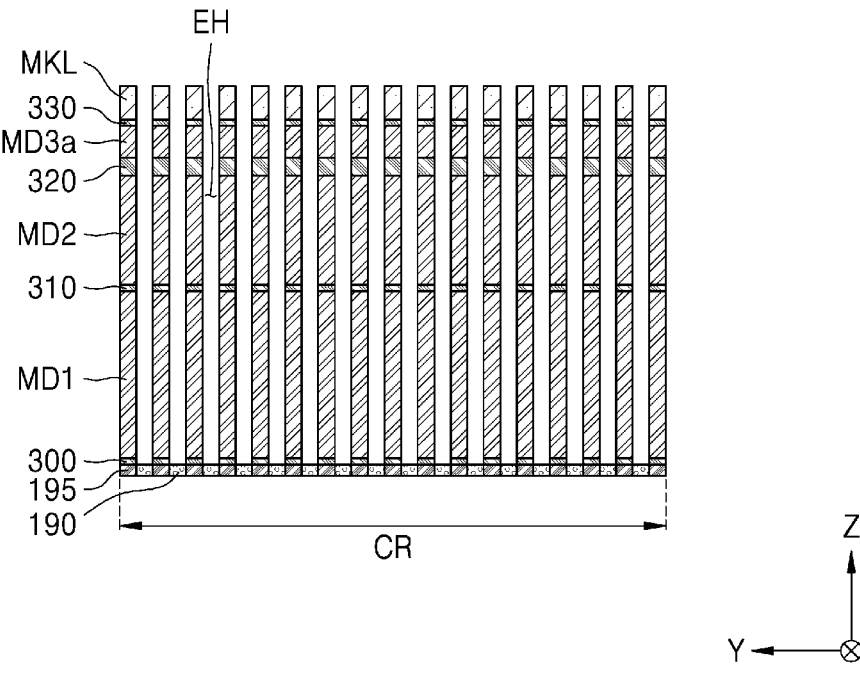
FIGS. 9A and 9B are cross-sectional views illustrating a method of fabricating a semiconductor memory device, according to an embodiment of the inventive concept.

The cell blocks SCB may indicate a memory cell region CR as illustrated in FIG. 2, a memory cell region CR as illustrated in FIGS. 8A to 8I, a memory cell region CR as illustrated in FIGS. 9A and 9B, or a region in which a plurality of active regions 118 as described with reference to FIGS. 3A to 7D are arranged. The peripheral region PR may indicate peripheral regions PR illustrated in FIGS. 8A to 8E.

FIG. 2 is a layout diagram illustrating components of a semiconductor memory device according to an embodiment of the inventive concept.

A semiconductor memory device 1 may include a plurality of active regions ACT formed in a memory cell region CR. In some embodiments, the plurality of active regions ACT formed in the memory cell region CR may be arranged to have long axes extending in a diagonal direction with respect to a first horizontal direction (the X direction) and a second horizontal direction (the Y direction). The plurality of active regions ACT may constitute the plurality of active regions 118 as illustrated in FIGS. 3A to 7D.

A plurality of word lines WL may extend in parallel in a first horizontal direction (the X direction) across a plurality of active regions ACT. A plurality of bit lines BL may extend in parallel in a second horizontal direction (the Y direction) crossing the first horizontal direction (the X direction) over the plurality of word lines WL.

In some embodiments, a plurality of buried contacts BC may be formed between two adjacent bit lines BL among the plurality of bit lines BL. In some embodiments, the plurality of buried contacts BC may be arranged in a line in each of the first horizontal direction (the X direction) and the second horizontal direction (the Y direction).

A plurality of landing pads LP may be formed over the plurality of buried contacts BC. The plurality of landing pads LP may partially overlap the plurality of buried contacts BC. In some embodiments, each of the plurality of landing pads LP may extend to an upper portion of one of two adjacent bit lines BL and partially overlap the upper portion of the one pf the two adjacent bit lines BL.

A plurality of storage nodes SN may be formed over the plurality of landing pads LP. The plurality of storage nodes SN may be formed over the plurality of bit lines BL. The plurality of storage nodes SN may be respectively formed as lower electrodes of a plurality of capacitors. The plurality of storage nodes SN may be respectively connected to the plurality of active regions ACT through the plurality of landing pad LP and the plurality of buried contact BC, respectively.

FIGS. 3A to 3D are cross-sectional views illustrating semiconductor memory devices according to embodiments of the inventive concept. FIGS. 3A to 3D are cross-sectional views respectively taken along line A-A', line B-B', line C-C', and line D-D' of FIG. 2.

Referring to FIGS. 3A to 3D, the semiconductor memory device 1 includes the plurality of active regions 118 defined by device isolation layers 116, a substrate 110 including a plurality of word line trenches 120T crossing the plurality of active regions 118, a plurality of word lines 120 arranged in the plurality of word line trenches 120T, a plurality of bit line structures 140, and a plurality of capacitor structures 200 including a plurality of lower electrodes 210, a capacitor dielectric layer 220, and an upper electrode 230.

The substrate 110 may include or may be formed of, for example, silicon (Si), crystalline Si, polycrystalline Si, or amorphous Si. In some embodiments, the substrate 110 includes or is formed of a semiconductor element, such as germanium (Ge), or at least one compound semiconductor selected from among silicon germanium (SiGe), silicon carbide (SiC), gallium arsenide (GaAs), indium arsenide (InAs), and indium phosphide (InP). In some embodiments, the substrate 110 may have or may be a silicon on insulator (SOI) structure. For example, the substrate 110 may include a buried oxide layer (BOX). The substrate 110 may include a conductive region, for example, a well doped with impurities or a structure doped with impurities.

The plurality of active regions 118 may be part of the substrate 110 defined by device isolation trenches 116T. The plurality of active regions 118 may have a relatively long island shape having a minor axis and a major axis in a plan view. In some embodiments, the plurality of active regions 118 may be arranged to have major axes extending in a diagonal direction with respect to the first horizontal direction (the X direction) and the second horizontal direction (the Y direction). The plurality of active regions 118 may extend in substantially the same length along the major axis and may be repeatedly arranged with a substantially constant pitch. Terms such as "same," "equal," "planar," "constant," or "coplanar," as used herein encompass near identicality including variations that may occur, for example, due to manufacturing processes. The term "substantially" may be used herein to emphasize this meaning, unless the context or other statements indicate otherwise.

The device isolation layers 116 may fill the device isolation trenches 116T. The plurality of active regions 118 may be defined at the substrate 110 by the device isolation layers 116.

In some embodiments, the device isolation layers 116 may each be composed of a triple layer including a first device isolation layer, a second device isolation layer, and a third device isolation layer, but are not limited thereto. For example, the first device isolation layer may conformally cover an inner surface and a bottom surface of the device isolation trench 116T. In some embodiments, the first device isolation layer may be formed of silicon oxide. For example, the second device isolation layer may conformally cover the first device isolation layer. In some embodiments, the second device isolation layer may be formed of silicon nitride. For example, the third device isolation layer may cover the second device isolation layer and fill the device isolation trench 116T. In some embodiments, the third device isolation layer may be formed of silicon oxide. For example, the third device isolation layer may be formed of silicon oxide formed of tonen silazene (TOSZ). In some embodiments, the device isolation layers 116 may each be composed of a single layer including one type of insulating layer, a double layer including two types of insulating layers, or a multilayer composed of a combination of at least four types of insulating layers. For example, the device isolation layers 116 may each be composed of a single layer formed of silicon oxide. The device isolation layers 116, when viewed in a plan view, may be connected with each other, and the connected device isolation layers 116 may define or surround each of the plurality of active regions 118.

The plurality of word line trenches 120T may be formed in the substrate 110 including the plurality of active regions 118 defined by the device isolation layers 116. The plurality of word line trenches 120T may extend in a first horizontal direction (the X direction) in parallel to each other and may have a line shape. The plurality of word line trenches 120T may cross the active regions 118 and may be substantially equally spaced in a second horizontal direction (the Y direction). In some embodiments, a step difference may be formed at a bottom surface of each of the plurality of word line trenches 120T.

A plurality of gate dielectric layers 122, a plurality of word lines 120, and a plurality of buried insulating layers 124 may be sequentially formed in the plurality of word line trenches 120T. The plurality of word lines 120 may constitute the plurality of word lines WL illustrated in FIG. 2. The plurality of word lines 120 may extend in the first horizontal direction (the X direction) in parallel to each other and may have a line shape. The plurality of word line trenches 120T may cross the active regions 118 and may be substantially equally spaced in the second horizontal direction (the Y direction). An upper surface of each of the plurality of word lines 120 may be at a lower vertical level than an upper surface of the substrate 110. A bottom surface of each of the plurality of word lines 120 may have an uneven shape due to step differences of the plurality of word line trenches 120T, and saddle fin transistors (saddle FinFETs) may be formed in the plurality of active regions 118.

A level or a vertical level described herein means a height in a vertical direction (the Z direction) with respect to a main surface or an upper surface of the substrate 110. That is, the same level or a constant level means a position in which the height in the vertical direction (the Z direction) with respect to the main surface or the upper surface of the substrate 110 is the same or constant, and a low/high vertical level means a position in which the height in the vertical direction (the Z direction) is lower/higher than the main surface of the substrate 110.

The plurality of word lines 120 may partially fill lower portions of the plurality of word line trenches 120T. Each of the plurality of word lines 120 may have a stacked structure of a lower word line layer 120*a* and an upper word line layer 120*b*. For example, a gate dielectric layer 122 is between the lower word line layer 120*a* and the word line trench 120T, and the lower word line layer 120*a* may conformally cover a bottom surface and an inner wall of a partial lower portion of each of the plurality of word line trenches 120T. For example, the upper word line layer 120*b* may cover the lower word line layer 120*a* and partially fill the lower portion of each of the plurality of word line trenches 120T. In some embodiments, the lower word line layer 120*a* may be formed of a metal material such as Ti and Ta or a conductive metal nitride such as TiN and TaN. In some embodiments, the upper word line layer 120*b* may be formed of, for example, doped polysilicon, a metal material such as W, a conductive metal nitride such as WN, TiSiN, and WSiN, or a combination thereof.

A source region and a drain region formed by injecting impurity ions into the active regions 118 may be arranged in the active regions 118 on opposite sides of the plurality of word lines 120 of the substrate 110.

The gate dielectric layer 122 may cover an inner wall and a bottom surface of each of the plurality of word line trenches 120T. In some embodiments, the gate dielectric layer 122 may extend from a position between the word line 120 and the word line trench 120T to a position between the buried insulating layer 124 and the word line trench 120T. The gate dielectric layer 122 may be formed of at least one selected from among silicon oxide, silicon nitride, silicon oxynitride, oxide/nitride/oxide (ONO), and a high-k dielectric material with a dielectric constant higher than a dielectric constant of silicon oxide. For example, the gate dielectric layer 122 may have a dielectric constant between about 10 and about 25. In some embodiments, the gate dielectric layer 122 may be formed of at least one material selected from among hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, the gate dielectric layer 122 may be formed of $HfO_2$, $Al_2O_3$, $HfAlO_3$, $Ta_2O_3$, or $TiO_2$. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The plurality of buried insulating layers 124 may partially fill upper portions of the plurality of word line trenches 120T. In some embodiments, upper surfaces of the plurality of buried insulating layers 124 may be at substantially the same vertical level as the upper surface of the substrate 110. The plurality of buried insulating layers 124 may be formed of at least one material layer selected from among silicon oxide, silicon nitride, silicon oxynitride, and a combination thereof. For example, the plurality of buried insulating layers 124 may be formed of silicon nitride.

First and second insulating layer patterns 112 and 114 may be arranged over the device isolation layers 116, the plurality of active regions 118, and the plurality of buried insulating layers 124. For example, the first and second insulating layer patterns 112 and 114 may be formed of silicon oxide, silicon nitride, silicon oxynitride, a metal-based dielectric material, or a combination thereof. In some embodiments, the first and second insulating layer patterns 112 and 114 may be composed of a stacked structure of a plurality of insulating layers including the first insulating layer pattern 112 and the second insulating layer pattern 114. In some embodiments, the first insulating layer pattern 112 may be formed of silicon oxide, and the second insulating layer pattern 114 may be formed of silicon oxynitride. In some other embodiments, the first insulating layer pattern 112 may be formed of a non-metal-based dielectric material, and the second insulating layer pattern 114 may be formed of a metal-based dielectric material. In some embodiments, the second insulating layer pattern 114 may be thicker than the first insulating layer pattern 112. For example, the first insulating layer pattern 112 may have a thickness between about 50 Å and about 90 Å, and the second insulating layer pattern 114 may have a thickness between about 60 Å and about 100 Å, which is thicker than the first insulating layer pattern 112.

A plurality of direct contact conductive patterns 134 may penetrate the insulating layer patterns 112 and 114 to partially fill a plurality of direct contact holes 134H exposing source regions in the active regions 118. In some embodiments, the plurality of direct contact holes 134H may extend into the source regions of the active regions 118. The plurality of direct contact conductive patterns 134 may be formed of, for example, doped polysilicon. In some embodiments, the plurality of direct contact conductive patterns 134 may each include an epitaxial silicon layer. The plurality of direct contact conductive patterns 134 may constitute a plurality of direct contacts DC illustrated in FIG. 2.

The plurality of bit line structures 140 may be arranged on the first and second insulating layer patterns 112 and 114. The plurality of bit line structures 140 may include a plurality of bit lines 147 and a plurality of insulating capping lines 148 covering the plurality of bit lines 147. The plurality of bit line structures 140 may extend in parallel in the second horizontal direction (the Y direction) parallel to the main surface of the substrate 110. The plurality of bit lines 147 may constitute the plurality of bit lines BL as illustrated in FIG. 2. The plurality of bit lines 147 may be electrically connected to the plurality of active regions 118 through the plurality of direct contact conductive patterns 134. In some embodiments, the plurality of bit line structures 140 may each further include a conductive semiconductor pattern 132 disposed between the first and second insulating layer patterns 112 and 114 and each of the plurality of bit lines 147. The conductive semiconductor pattern 132 may be formed of, for example, doped polysilicon. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. As used herein, components described as being "electrically connected" are configured such that an electrical signal can be transferred from one component to the other (although such electrical signal may be attenuated in strength as it transferred and may be selectively transferred).

The plurality of bit lines 147 may each have a stacked structure of a line-shaped first metal-based conductive pattern 145 and a second metal-based conductive pattern 146. In some embodiments, the first metal-based conductive pattern 145 may be formed of titanium nitride (TiN) or TSN (Ti—Si—N), and the second metal-based conductive pattern 146 may be formed of tungsten (W) or tungsten silicide (WSix). In some embodiments, the first metal-based conductive pattern 145 may serve as a diffusion barrier. In some embodiments, the plurality of insulating capping lines 148 may be formed of silicon nitride.

A plurality of insulating spacer structures 150 may cover both sidewalls of the plurality of bit line structures 140. Each of the plurality of insulating spacer structures 150 may include a first insulating spacer 152, a second insulating spacer 154, and a third insulating spacer 156. In some embodiments, the plurality of insulating spacer structures 150 may extend into the plurality of direct contact holes 134H to cover opposite sidewalls of the plurality of direct contact conductive patterns 134. The second insulating spacer 154 may be formed of a material with a lower dielectric constant than dielectric constants of the first insulating spacer 152 and the third insulating spacer 156. In some embodiments, the first insulating spacer 152 and the third insulating spacer 156 may be formed of nitride (e.g., silicon nitride), and the second insulating spacer 154 may be formed of oxide (e.g., silicon oxide). In some embodiments, the first insulating spacer 152 and the third insulating spacer 156 are formed of nitride (e.g., silicon nitride), and the second insulating spacer 154 may be formed of a material with etch selectivity with respect to the first insulating spacer 152 and the third insulating spacer 156. For example, the first insulating spacer 152 and the third insulating spacer 156 may be formed of nitride (e.g., silicon nitride), and the second insulating spacer 154 may be formed as an air spacer. In some embodiments, the insulating spacer structure 150 may include the second insulating spacer 154 formed of oxide (e.g., silicon oxide) and the third insulating spacer 156 formed of nitride (e.g., silicon nitride). The term "air" as discussed herein, may refer to atmospheric air, or other gases that may be present during the manufacturing process. The air spacer may refer to a region filled with air to serve as an insulating spacer.

Each of a plurality of insulating fences 180 may be arranged in a space between a pair of insulating spacer structures 150 facing each other between a pair of adjacent bit line structures 140. The plurality of insulating fences 180 may be arranged in a row while being separated from each other between pairs of insulating spacer structures 150 facing each other in the second horizontal direction (the Y direction). For example, the plurality of insulating fences 180 may be formed of nitride.

In some embodiments, the plurality of insulating fences 180 may penetrate the first and second insulating layer patterns 112 and 114 and extend into the plurality of buried insulating layers 124 but are not limited thereto. In some other embodiments, the plurality of insulating fences 180 may penetrate the first and second insulating layer patterns 112 and 114 without extending into the plurality of buried insulating layers 124, may extend into the first and second insulating layer patterns 112 and 114 without penetrating the insulating layer patterns 112 and 114, or may not extend into the first and second insulating layer patterns 112 and 114 such that lower surfaces of the plurality of insulating fences 180 may be in contact with the first and second insulating layer patterns 112 and 114.

A plurality of buried contact holes 170H may be defined between the plurality of bit lines 147 and between the plurality of insulating fences 180. The plurality of buried contact holes 170H and the plurality of insulating fences 180 may be alternately arranged between the pair of insulating spacer structures 150 facing, in the second horizontal direction (the Y direction), each other among the plurality of insulating spacer structures 150 covering opposite sidewalls of the plurality of bit line structures 140. An inner space of each of the plurality of buried contact holes 170H may be defined by the insulating spacer structure 150 covering sidewalls of each of the two adjacent bit lines 147, the plurality of insulating fences 180, and the active region 118 between the two adjacent bit lines 147 of the plurality of bit lines 147. In some embodiments, each of the plurality of buried contact holes 170H may extend from a position between the insulating spacer structure 150 and each of the plurality of insulating fences 180 into the active region 118.

The plurality of buried contacts 170 may be arranged in the plurality of buried contact holes 170H. The plurality of buried contacts 170 may partially fill lower portions of spaces between the plurality of insulating fences 180 and the plurality of insulating spacer structures 150 covering both sidewalls of the plurality of bit line structures 140. The plurality of buried contacts 170 and the plurality of insulating fences 180 may be alternately arranged in positions between the pairs of insulating spacer structures 150 each facing each other among the plurality of insulating spacer structures 150 covering both sidewalls of the plurality of bit line structures 140, that is, in the second horizontal direction (the Y direction). For example, the plurality of buried contacts 170 may be formed of polysilicon. For example, each of the plurality of buried contacts 170 may be disposed between corresponding two adjacent insulating fences of the plurality of insulating fences 180, and between corresponding two adjacent bit line structures of the plurality of bit line structures 140 with two insulating spacer structures on facing inner sidewalls of the two adjacent bit line structures.

In some embodiments, the plurality of buried contacts 170 may be arranged in a line in each of the first horizontal direction (the X direction) and the second horizontal direction (the Y direction). Each of the plurality of buried contacts 170 may extend from the active region 118 in a vertical direction (the Z direction) perpendicular to the substrate 110. The plurality of buried contacts 170 may constitute the plurality of buried contacts BC illustrated in FIG. 2.

Levels of upper surfaces of the plurality of buried contacts 170 may be lower than levels of upper surfaces of the plurality of insulating capping lines 148. Upper surfaces of the plurality of insulating fences 180 and the upper surfaces of the plurality of insulating capping lines 148 may be at the same vertical level with respect to the vertical direction (the Z direction). For example, the upper surfaces of the plurality of insulating fences 180 and the upper surfaces of the plurality of insulating capping lines 148 may be coplanar.

A plurality of landing pad holes 190H may be defined by the plurality of buried contacts 170, the plurality of insulating spacer structures 150, and the plurality of insulating fences 180. The plurality of buried contacts 170 may be exposed at bottom surfaces of the plurality of landing pad holes 190H.

A plurality of landing pads 190 may fill at least a part of the plurality of landing pad holes 190H and extend onto the plurality of bit line structures 140. The plurality of landing pads 190 may be separated from each other by recess portions 190R. Each of the plurality of landing pads 190 may include or may be formed of a conductive barrier layer and a conductive pad material layer on the conductive barrier layer. For example, the conductive barrier layer may be formed of a metal, a conductive metal nitride, or a combination thereof. In some embodiments, the conductive barrier layer may have a Ti/TiN stacked structure. In some embodiments, the conductive pad material layer may include tungsten (W). In some embodiments, a metal silicide layer may be formed between each of the plurality of landing pads 190 and each of the plurality of buried contact 170. The metal silicide layer may be formed of cobalt silicide ($CoSi_x$), nickel silicide ($NiSi_x$), or manganese silicide ($MnSi_x$) but is not limited thereto.

The plurality of landing pads 190 may be arranged on the plurality of buried contacts 170, and the plurality of buried contacts 170 and the plurality of landing pads 190 may be electrically connected with each other, respectively. The plurality of landing pads 190 may be connected to the plurality of active regions 118 through the plurality of buried contacts 170, respectively. The plurality of landing pads 190 may constitute the plurality of landing pads LP as illustrated in FIG. 2. Each of the plurality of buried contacts 170 may be between two adjacent bit line structures 140, and each of the plurality of landing pads 190 may extend from a position between two adjacent bit line structures 140 with the buried contact 170 therebetween onto one bit line structure 140.

Figure 3A:
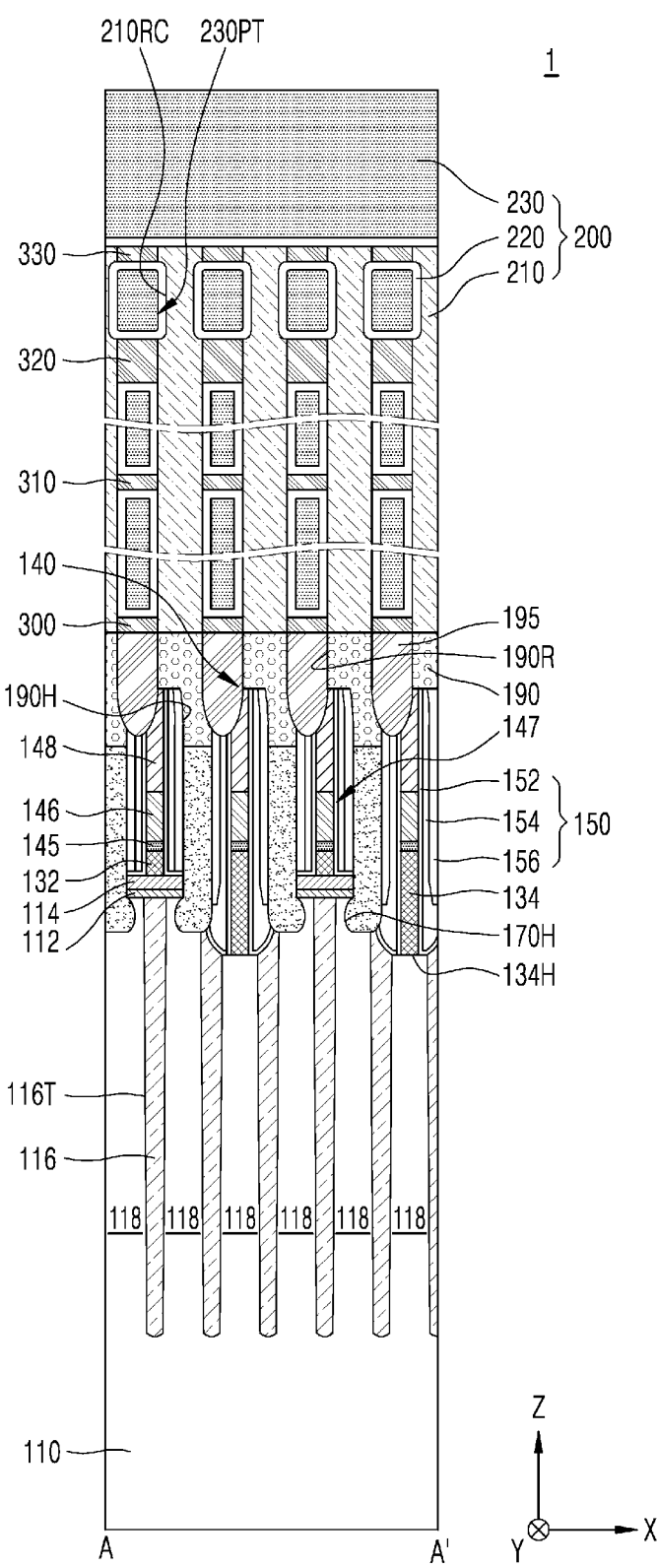
FIGS. 3A to 3D are cross-sectional views illustrating semiconductor memory devices according to embodiments of the inventive concept.
Figure 3B:
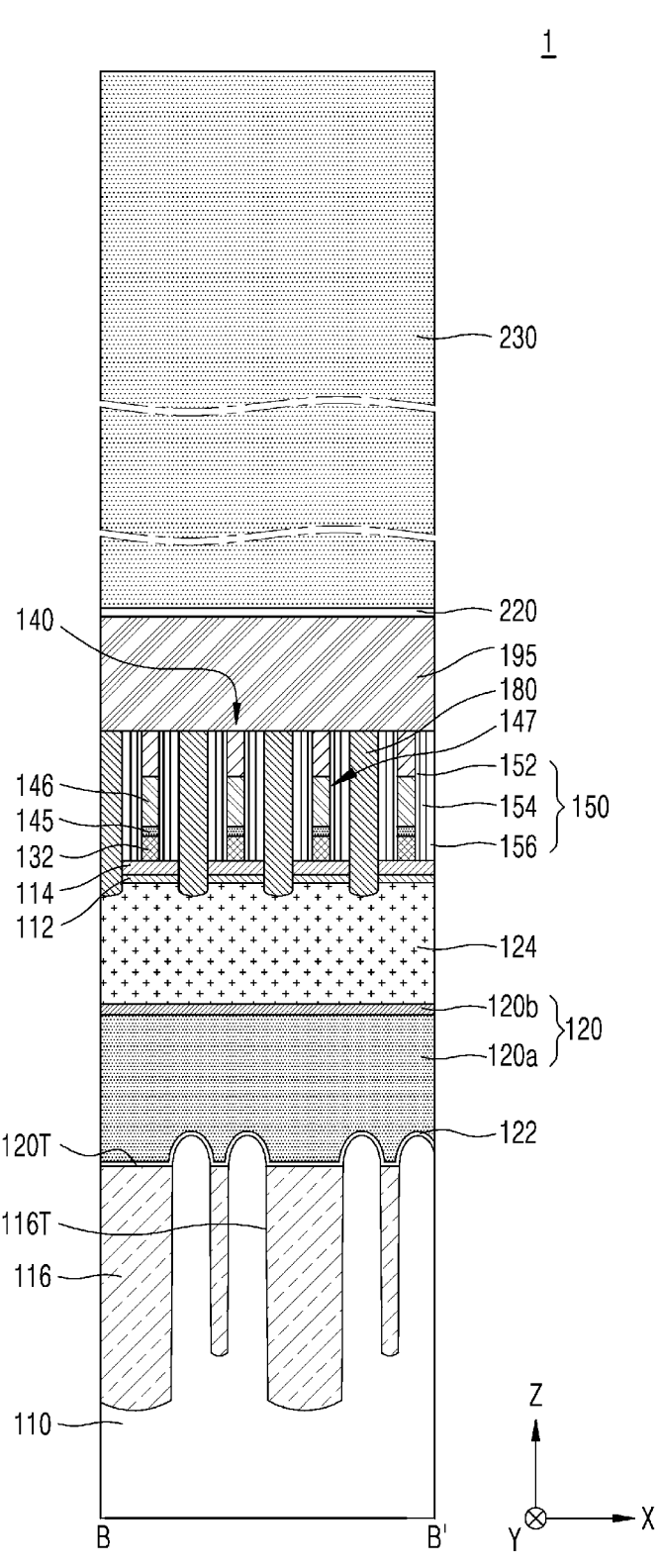
Figure 3C:
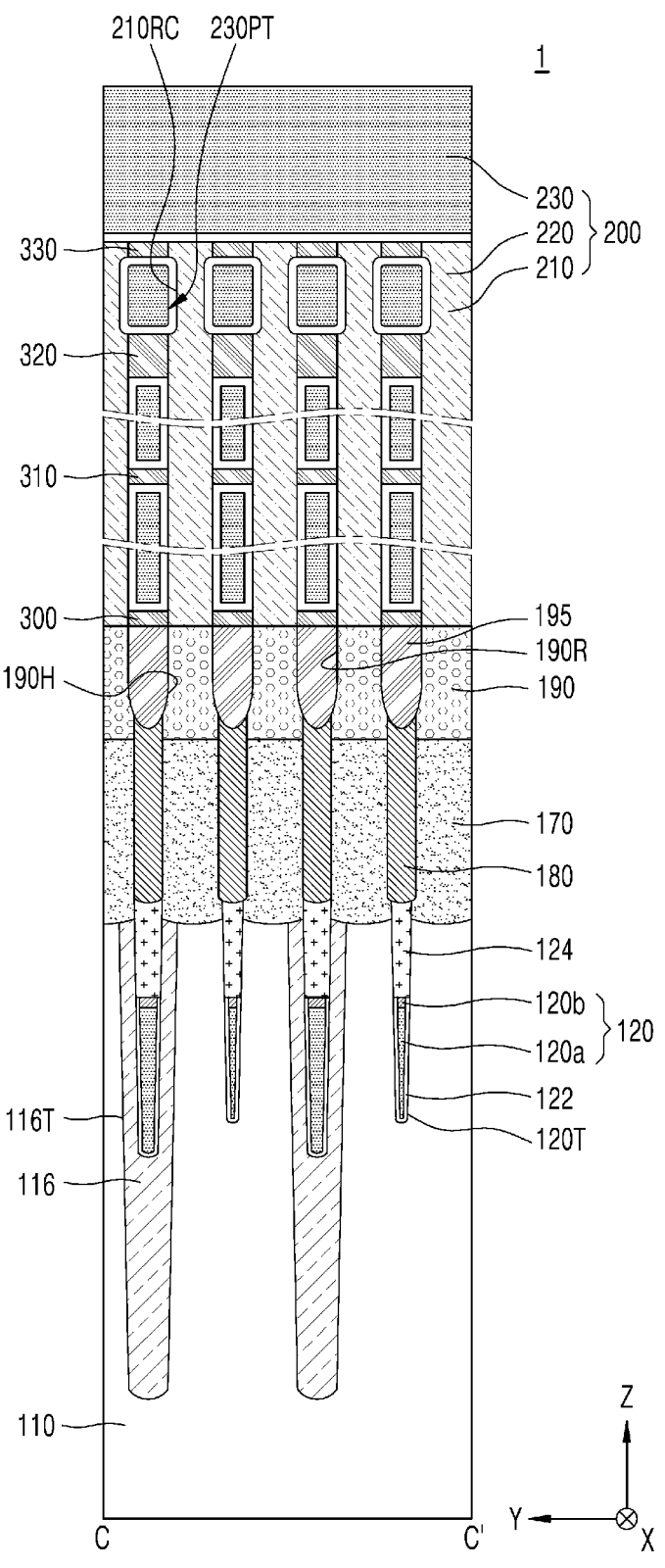
Figure 3D:
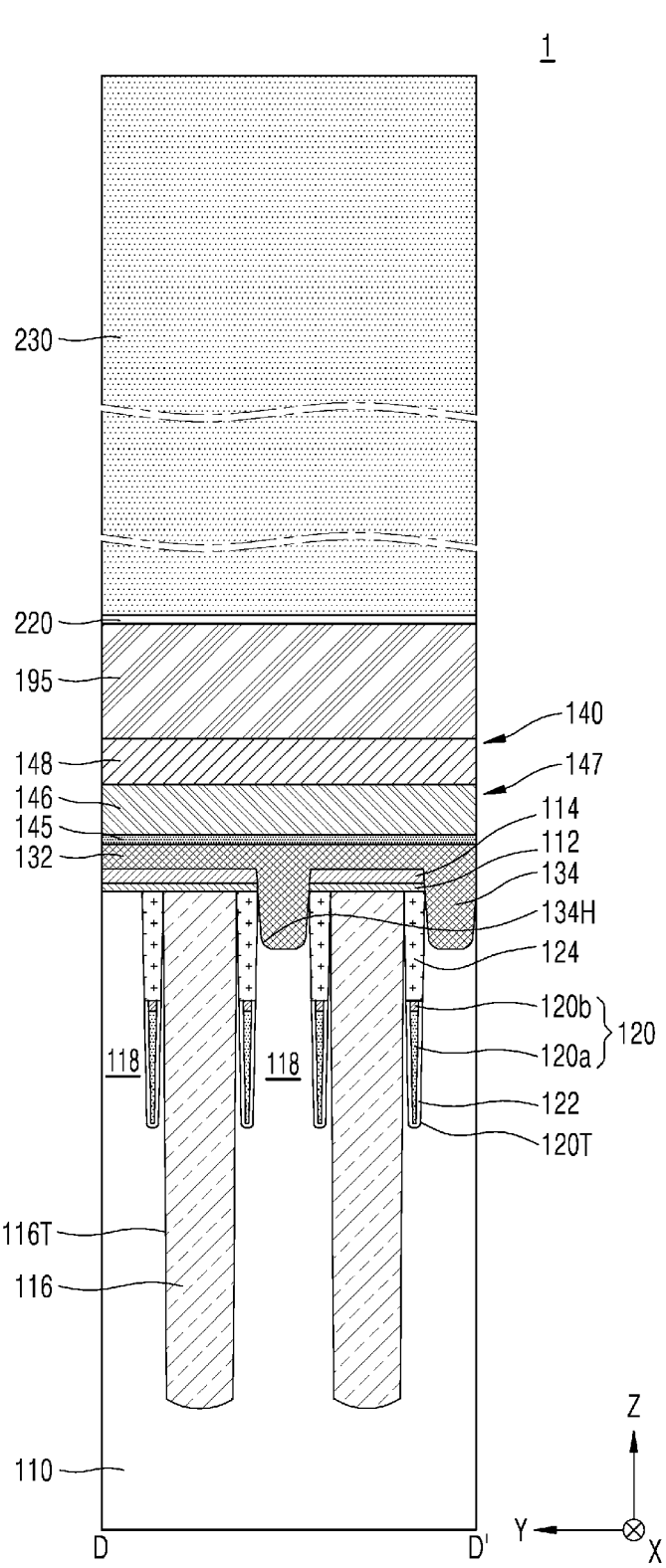
Figure 4A:
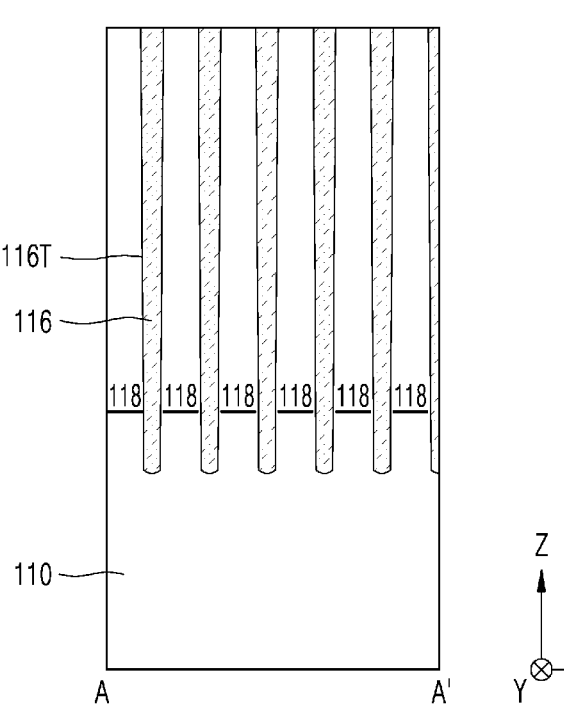
FIGS. 4A to 4D, 5A to 5D, 6A to 6D, 7A to 7D, and 8A to 8J are cross-sectional views illustrating methods of fabricating semiconductor memory devices, according to embodiments of the inventive concept.
Figure 4B:
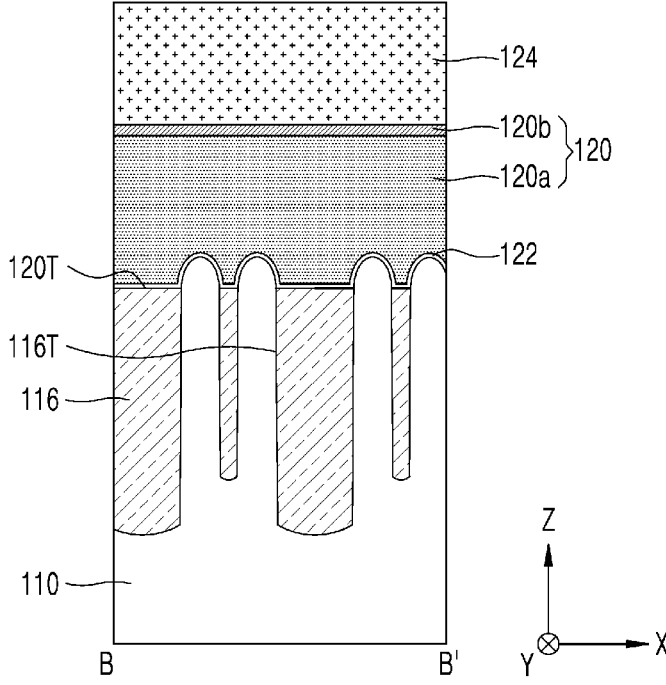
Figure 4C:
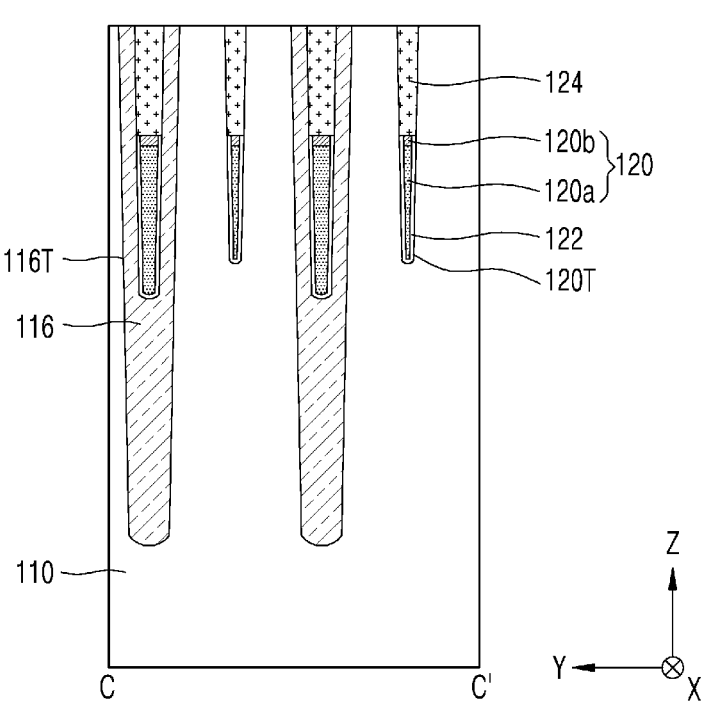
Figure 4D:
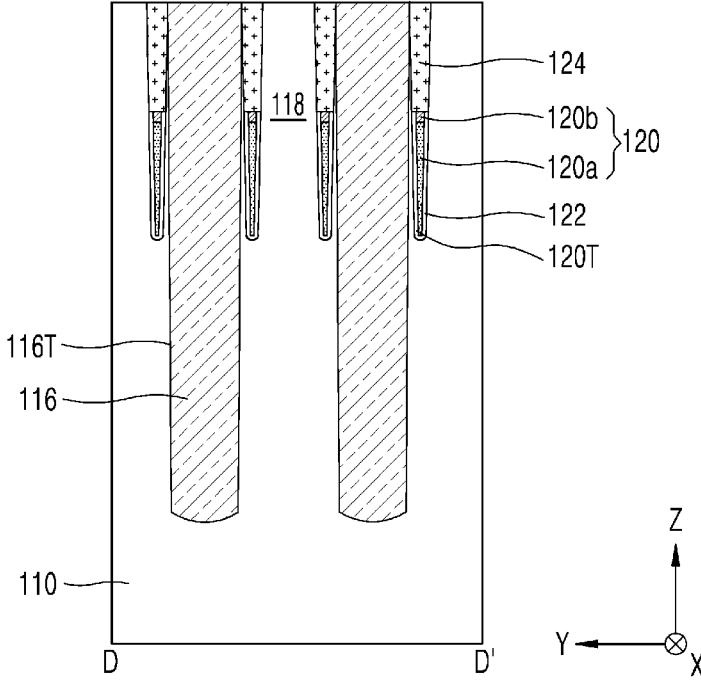
Figure 5A:
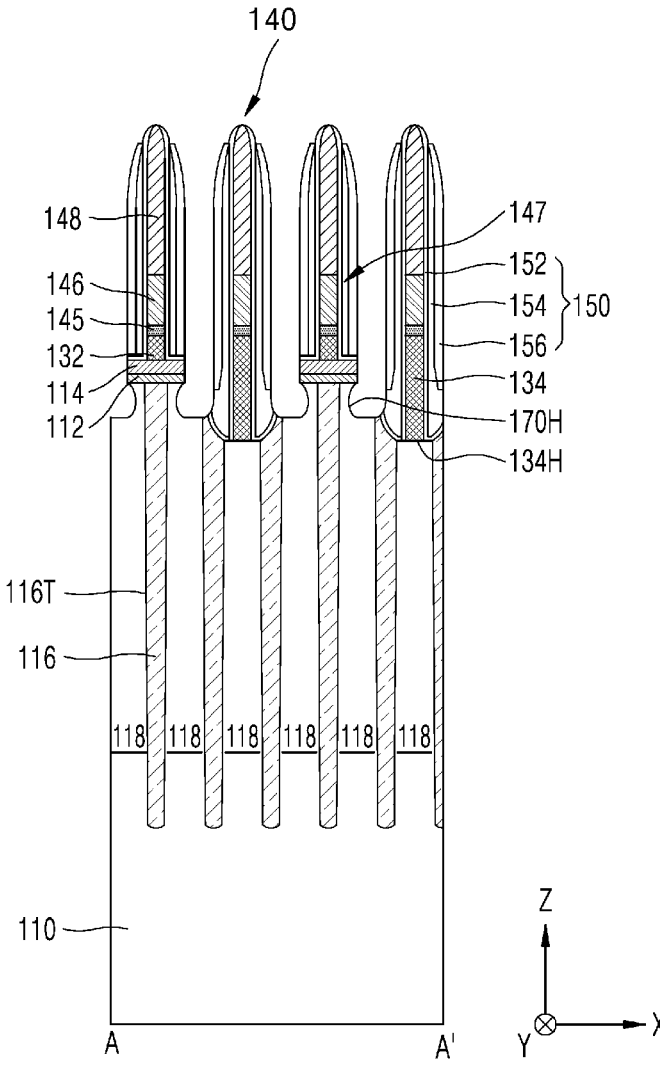
Figure 5B:
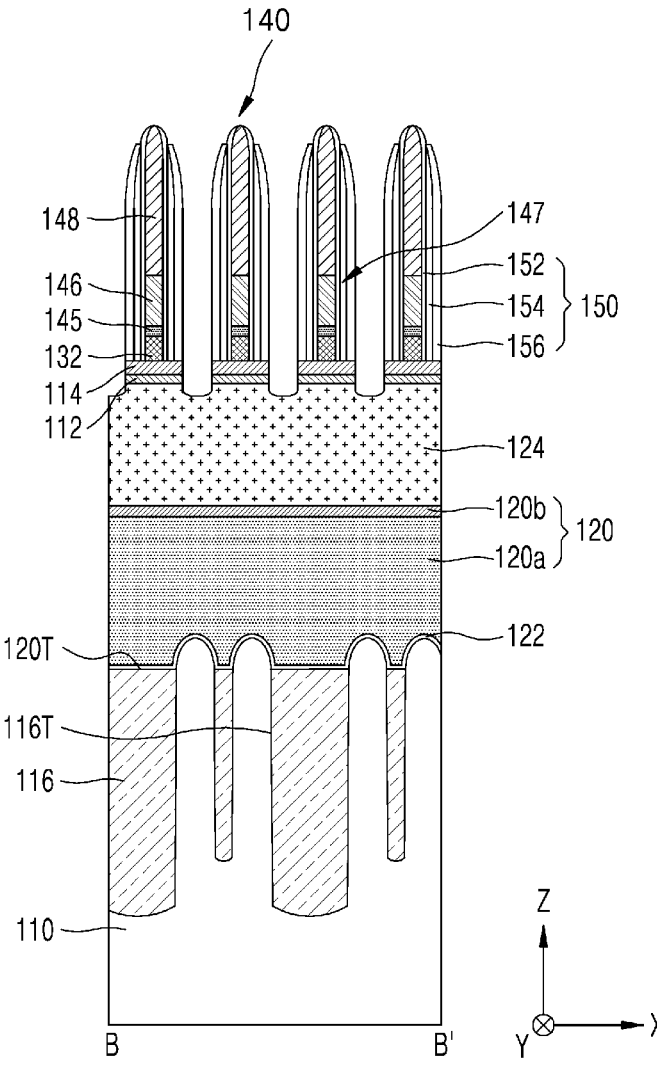
Figure 5C:
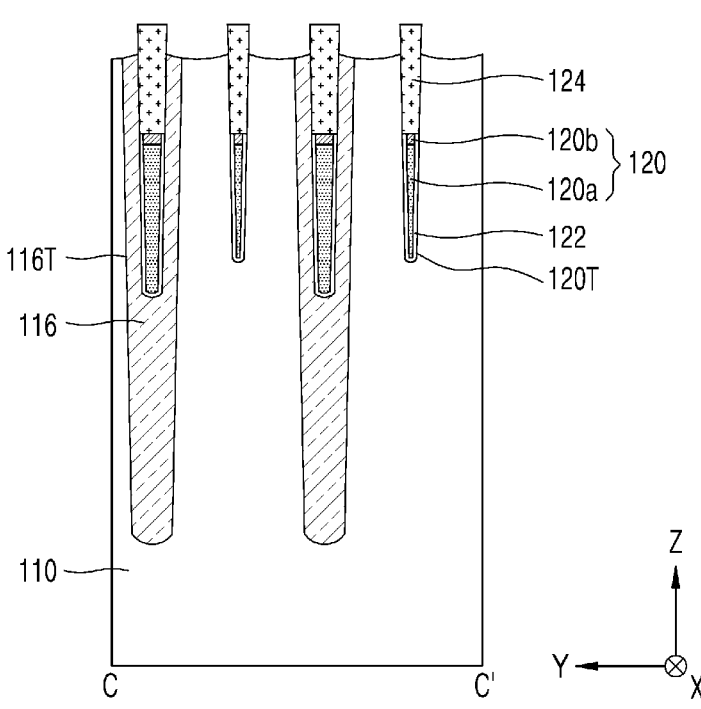
Figure 5D:
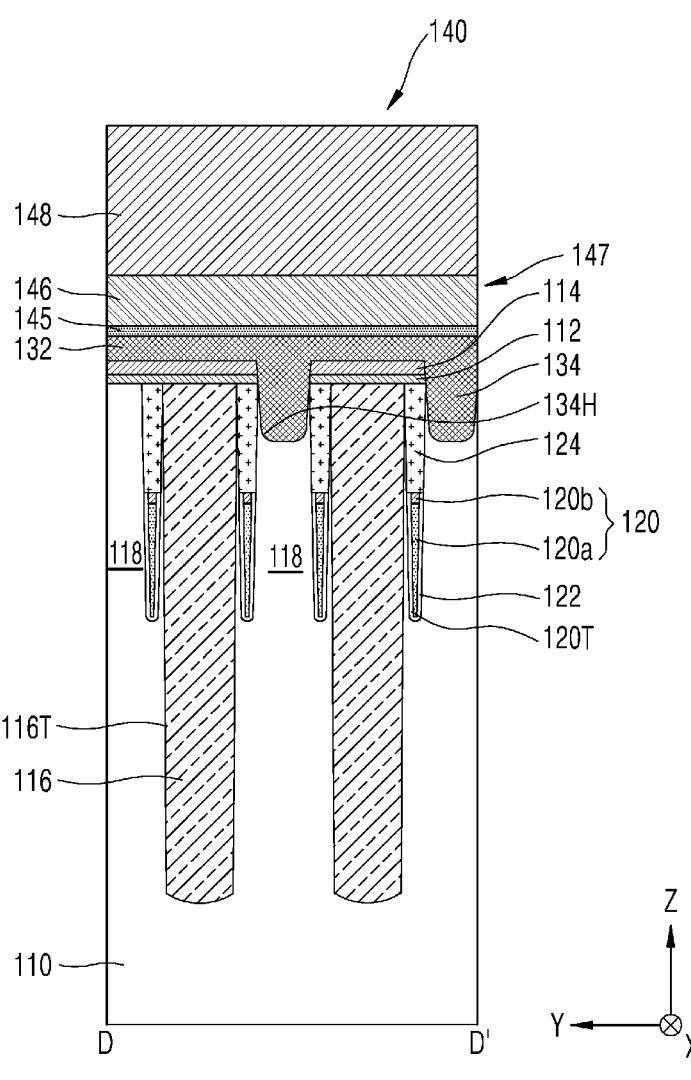
Figure 6A:
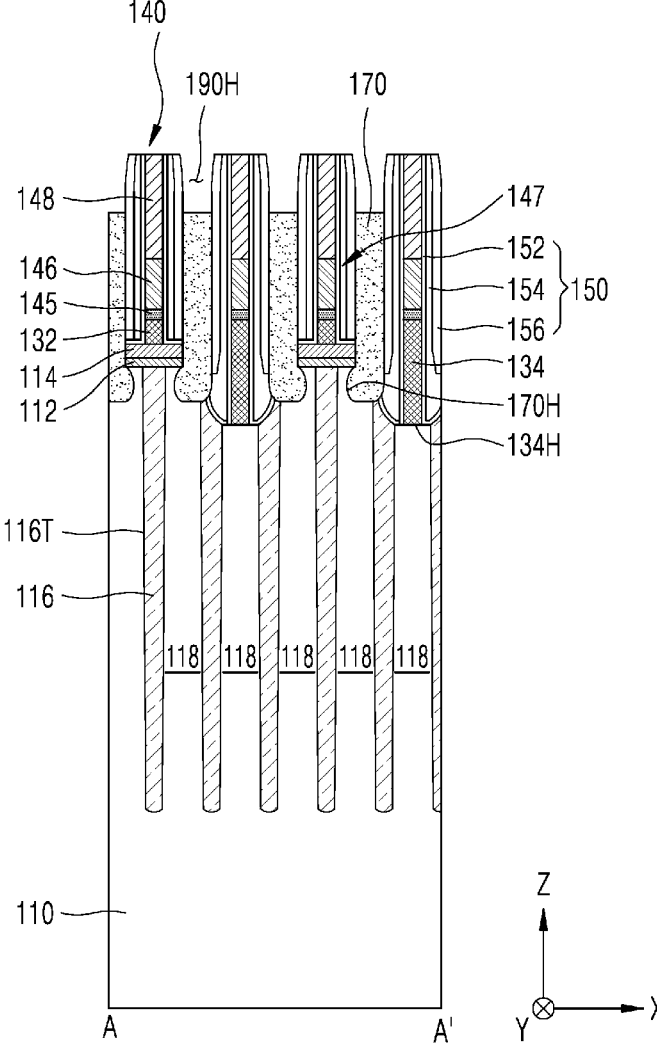
Figure 6B:
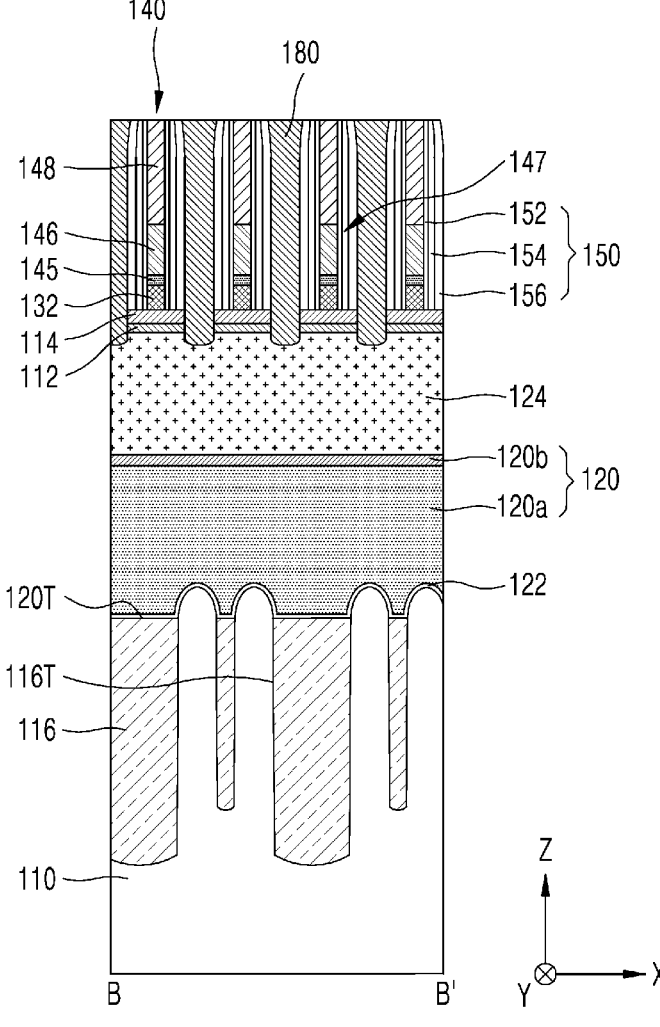
Figure 6C:
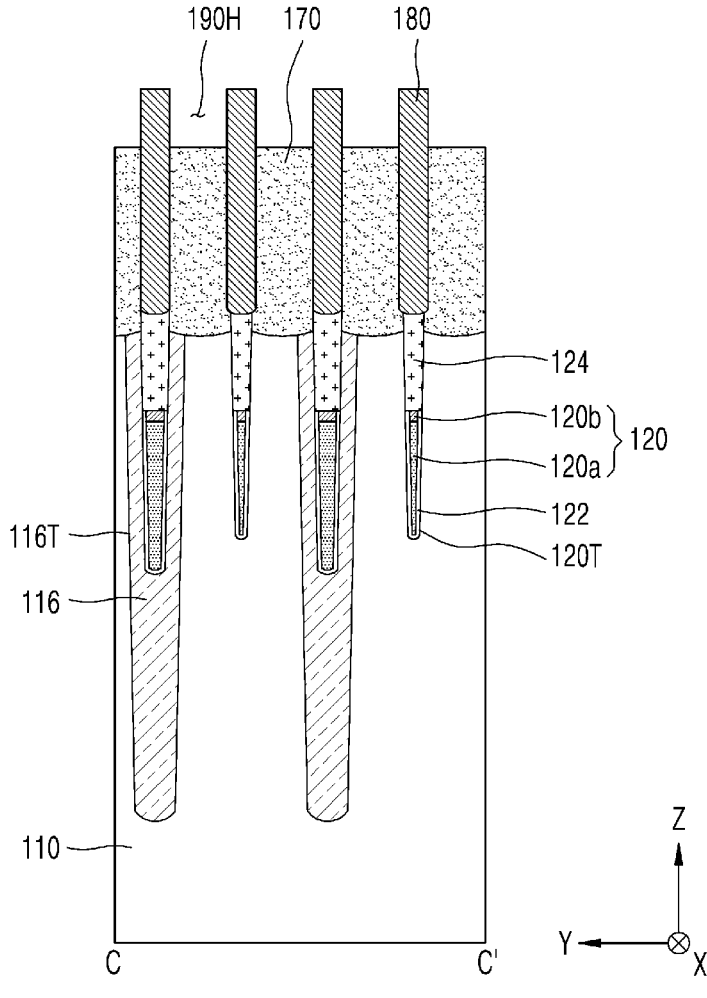
Figure 6D:
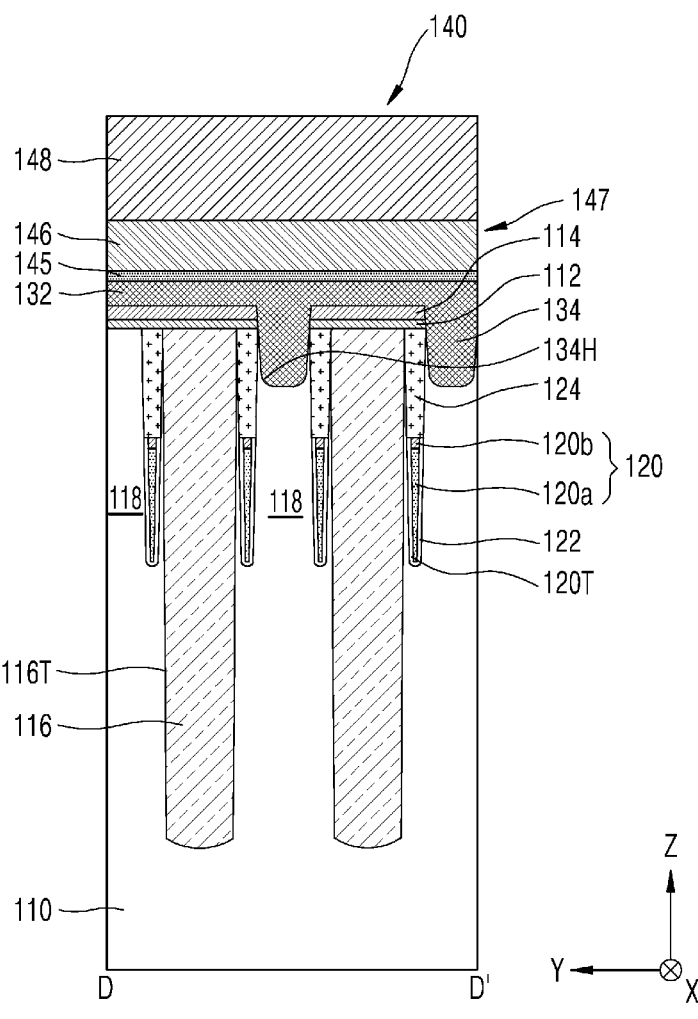

The recess portions 190R may be filled respectively with insulating structures 195. In some embodiments, the insulating structures 195 may each include an interlayer insulating layer and an etch stop layer. For example, the interlayer insulating layer may be formed of oxide (e.g., silicon oxide), and the etch stop layer may be formed of nitride (e.g., silicon nitride). FIGS. 3A and 3C illustrate that upper surfaces of the insulating structures 195 and upper surfaces of the plurality of landing pads 190 are at the same vertical level or are coplanar but are not limited thereto. For example, the insulating structures 195 may have upper surfaces at a vertical level higher than the upper surface of the plurality of landing pads 190 by filling the recess portions 190R and covering the upper surfaces of the plurality of landing pads 190.

An etch stop layer 300 and the plurality of capacitor structures 200 including the plurality of lower electrodes 210, the capacitor dielectric layer 220, and the upper electrode 230 may be arranged on the plurality of landing pads 190 and the insulating structures 195. The etch stop layer 300 may be formed of, for example, silicon nitride or silicon boron nitride (SiBN). The plurality of lower electrodes 210 may penetrate the etch stop layer 300 to be in contact with the plurality of landing pads 190. The plurality of lower electrodes 210 and the plurality of landing pads 190 corresponding to each other may be electrically connected to each other.

Support patterns 310, 320, and 330 may be in contact with sidewalls of the plurality of lower electrodes 210 to support the plurality of lower electrodes 210. In some embodiments, the support patterns 310, 320, and 330 may include a first support pattern 310, a second support pattern 320, and a third support pattern 330 that are in contact with the sidewalls of the plurality of lower electrodes 210 and are at different vertical levels to be separated from each other in the vertical direction (the Z direction).

The first support pattern 310 may be at a high vertical level in the vertical direction (the Z direction) from the etch stop layer 300 to be in contact with the sidewalls of the plurality of lower electrodes 210, and the second support pattern 320 may be at a high vertical level in the vertical direction (the Z direction) from the first support pattern 310 to be in contact with the sidewalls of the plurality of lower electrodes 210. The first support pattern 310 may be in contact with the sidewalls of the plurality of lower electrodes 210 in the vertical direction (the Z direction) of the plurality of lower electrodes 210 near the middle thereof. In some embodiments, the first support pattern 310 may be in contact with the sidewalls of the plurality of lower electrodes 210 at a vertical level slightly higher than the middle thereof in the vertical direction (the Z direction) of the plurality of lower electrodes 210. In some other embodiments, the first support pattern 310 may be in contact with the sidewalls of the plurality of lower electrodes 210 at a vertical level slightly lower than the middle thereof in the vertical direction (the Z direction) of the plurality of lower electrodes 210. In some embodiments, the second support pattern 320 may be in contact with the sidewalls of the plurality of lower electrodes 210 at a vertical level higher than the middle in the vertical direction (the Z direction) of the plurality of lower electrodes 210. For example, the second support pattern 320 may be at a vertical level lower than uppermost ends of the plurality of lower electrodes 210 and higher than the middle thereof in the vertical direction (the Z direction) to be in contact with the sidewalls of the plurality of lower electrodes 210. The uppermost ends of the plurality of lower electrodes 210 may protrude upward from an upper surface of the second support pattern 320. That is, the upper surface of the second support pattern 320 may be at a lower vertical level than the uppermost ends of the plurality of lower electrodes 210. The third support pattern 330 may be in contact with upper sidewalls of the plurality of lower electrodes 210. In some embodiments, an upper surface of the third support pattern 330 may be at the same vertical level as the uppermost ends of the plurality of lower electrodes 210. The first support pattern 310, the second support pattern 320, and the third support pattern 330 may be formed of any one of silicon nitride (SiN), silicon carbonitride (SiCN), N-rich silicon nitride (N-rich SiN), and Si-rich silicon nitride (Si-rich SiN) but are not limited thereto. In some embodiments, the third support pattern 330 may be omitted.

The capacitor dielectric layer 220 may conformally cover surfaces of the plurality of lower electrodes 210 and the support patterns 310, 320, and 330 in contact with sidewalls of the plurality of lower electrodes 210. In some embodiments, the capacitor dielectric layer 220 may be integrally formed to cover the plurality of lower electrodes 210 and at least one of the support patterns 310, 320, and 330 in a certain region, for example, one memory cell region (CR of FIG. 2). The plurality of lower electrodes 210 may constitute the plurality of storage nodes SN illustrated in FIG. 2.

Each of the plurality of lower electrodes 210 may have a columnar shape of which the inside is filled to have a circular horizontal cross-section, that is, a pillar shape but is not limited thereto. In some embodiments, each of the plurality of lower electrodes 210 may have a cylindrical shape with a closed lower portion. In some embodiments, the plurality of lower electrodes 210 may be arranged in a honeycomb shape arranged in a zigzag in the first horizontal direction (the X direction) or the second horizontal direction (the Y direction). In some other embodiments, the plurality of lower electrodes 210 may be arranged in a matrix arranged in a line in each of the first horizontal direction (the X direction) and the second horizontal direction (the Y direction). The plurality of lower electrodes 210 may be formed of either a metal, such as silicon doped with impurities, tungsten, or copper, or a conductive metal compound, such as titanium nitride. FIGS. 3A and 3C illustrate that upper surfaces of the insulating structures 195 and lower surfaces of the plurality of lower electrodes 210 are at the same vertical level but are not limited thereto.

The capacitor dielectric layer 220 may be formed of, for example, TaO, TaAlO, TaON, AlO, AlSiO, HfO, HfSiO, ZrO, ZrSiO, TiO, TiAlO, BST((Ba,Sr)TiO), STO(SrTiO), BTO(BaTiO), PZT(Pb(Zr,Ti)O), (Pb,La)(Zr,Ti)O, Ba(Zr,Ti)O, Sr(Zr,Ti)O, or a combination thereof.

The upper electrode 230 may have a stacked structure of one or at least two of a doped semiconductor material layer, a main electrode layer, and an interface layer. The doped semiconductor material layer may include at least one of, for example, doped polysilicon and doped polycrystalline silicon germanium (SiGe). The main electrode layer may be formed of a metal material. The main electrode layer may be formed of, for example, W, Ru, RuO, Pt, PtO, Ir, IrO SRO(SrRuO), BSRO((Ba,Sr)RuO), CRO(CaRuO), BaRuO, La(Sr,Co)O, or so on. In some embodiments, the main electrode layer may be formed of W. The interface layer may be formed of at least one of metal oxide, metal nitride, metal carbide, and metal silicide.

The plurality of lower electrodes 210 may have electrode concave portions 210 RC, each having a relatively narrow horizontal width in an upper portion thereof. The electrode concave portions 210 RC may respectively surround upper portions of the plurality of lower electrodes 210. Spaces defining the electrode concave portions 210 RC in the plurality of lower electrodes 210 may be referred to as electrode recesses, which will be described with reference to FIG. 8J. The electrode recesses may respectively completely surround upper portions of the plurality of lower electrodes 210. The electrode concave portions 210 RC may be at portions protruding upward from the upper surface of the second support pattern 320. In some embodiments, each of the electrode concave portions 210 RC may be between the upper surface of the second support pattern 320 and a lower surface of the third support pattern 330. Horizontal widths of the electrode concave portions 210 RC may be less than horizontal widths of the plurality of lower electrodes 210 surrounded by the second support pattern 320. For example, the horizontal widths of the electrode concave portions 210 RC may each be a half or more of a horizontal width of each of the plurality of lower electrodes 210 surrounded by the second support pattern 320 and may be less than the horizontal width of each of the plurality of lower electrodes 210 surrounded by the second support pattern 320.

The upper electrode 230 may have a plurality of electrode protrusions 230PT protruding toward the electrode concave portions 210 RC of the plurality of lower electrodes 210, respectively. An upper portion of the upper electrode 230 higher than the upper surface of the second support pattern 320 has the electrode protrusion 230PT, and thus, the upper portion of the upper electrode 230 may protrude toward the plurality of lower electrodes 210 beyond a sidewall of a portion of the upper electrode 230 between the first support pattern 310 and the second support pattern 320. The capacitor dielectric layer 220 may be between the upper electrode 230 and the electrode protrusions 230PT, and the electrode protrusions 230PT may surround sidewalls of upper portions of the plurality of lower electrodes 210 at which the electrode concave portions 210 RC are located. The electrode protrusions 230PT may be disposed over the upper surface of the second support pattern 320. In some embodiments, the electrode protrusions 230PT may be between the upper surface of the second support pattern 320 and a lower surface of the third support pattern 330. The electrode concave portions 210 RC and the electrode protrusions 230PT are described in detail with reference to FIG. 8J.

The plurality of lower electrodes 210 included in the semiconductor memory device 1 according to the inventive concept may be formed to have a relatively great height. Accordingly, the semiconductor memory device 1 according to the inventive concept may secure capacitance of a capacitor.

FIGS. 4A to 4D, 5A to 5D, 6A to 6D, 7A to 7D, and 8A to 8J are cross-sectional views illustrating methods of fabricating semiconductor memory devices, according to embodiments of the inventive concept. FIGS. 4A, 5A, 6A, and 7A are cross-sectional views taken along line A-A' of FIG. 2, and FIGS. 4B, 5B, 6B, and 7B are cross-sectional views taken along line B-B' of FIG. 2, FIGS. 4C, 5C, 6C, and 7C are cross-sectional views taken along line C-C' of FIG. 2, FIGS. 4D, 5D, 6D, and 7D are cross-sectional views taken along line D-D' of FIG. 2.

Referring to FIGS. 4A to 4D, a part of the substrate 110 may be removed to form the plurality of active regions 118 defined by the device isolation trenches 116T.

The plurality of active regions 118 may be formed to have a relatively long island shape having a minor axis and a major axis in a plan view. In some embodiments, the plurality of active regions 118 may be formed to have major axes extending in a diagonal direction with respect to the first horizontal direction (the X direction) and the second horizontal direction (the Y direction).

The device isolation layers 116 filling the device isolation trenches 116T may be formed. The plurality of active regions 118 may be defined at the substrate 110 by the device isolation layers 116. In some embodiments, the device isolation layers 116 may each be composed of a triple layer including a first device isolation layer, a second device isolation layer, and a third device isolation layer, but are not limited thereto. For example, the first device isolation layer may be formed to conformally cover an inner surface and a bottom surface of the device isolation trench 116T. In some embodiments, the first device isolation layer may be formed of silicon oxide. For example, the second device isolation layer may be formed to conformally cover the first device isolation layer. In some embodiments, the second device isolation layer may be formed of silicon nitride. For example, the third device isolation layer may be formed to cover the second device isolation layer and fill the device isolation trench 116T. In some embodiments, the third device isolation layer may be formed of silicon oxide. For example, the third device isolation layer may be formed of silicon oxide formed of tonen silazene (TOSZ). In some embodiments, the device isolation layers 116 may each be formed to be composed of a single layer including one type of insulating layer, a double layer including two types of insulating layers, or a multilayer composed of a combination of at least four types of insulating layers. For example, the device isolation layers 116 may each be formed to be composed of a single layer formed of silicon oxide. The device isolation layers 116, when viewed in a plan view, may be connected with each other, and the connected device isolation layers 116 may define or surround each of the plurality of active regions 118.

The plurality of word line trenches 120T may be formed in the substrate 110 including the plurality of active regions 118 defined by the device isolation layers 116. The plurality of word line trenches 120T may extend in a first horizontal direction (the X direction) in parallel to each other and may be formed to have a line shape. The plurality of word line trenches 120T may cross the active regions 118 and may be substantially equally spaced in a second horizontal direction (the Y direction). In some embodiments, a step difference may be formed at a bottom surface of each of the plurality of word line trenches 120T.

After a resulting structure of forming the plurality of word line trenches 120T is cleaned, the plurality of gate dielectric layers 122, the plurality of word lines 120, and the plurality of buried insulating layers 124 may be sequentially formed in the plurality of word line trenches 120T. The plurality of word lines 120 may extend in the first horizontal direction (the X direction) in parallel to each other and may have a line shape. The plurality of word line trenches 120T may cross the active regions 118 and may be substantially equally spaced in the second horizontal direction (the Y direction). An upper surface of each of the plurality of word lines 120 may be formed to be at a lower vertical level than an upper surface of the substrate 110 (see, FIG. 4C). Bottom surfaces of the plurality of word lines 120 may have an uneven shape due to step differences formed at bottom surfaces of the plurality of word line trenches 120T. A saddle fin type transistor (a saddle FinFET) may be formed in each of the plurality of active regions 118.

The plurality of gate dielectric layers 122 may be formed to cover inner walls and bottom surfaces of the plurality of word line trenches 120T. In some embodiments, the plurality of gate dielectric layers 122 may be formed to extend from positions between the plurality of word lines 120 and the plurality of word line trenches 120T to positions between the plurality of buried insulating layers 124 and the plurality of word line trenches 120T.

The plurality of word lines 120 may be formed to fill lower portions of the plurality of word line trenches 120T. Each of the plurality of word lines 120 may be formed to have a stacked structure of a lower word line layer 120a and an upper word line layer 120b. For example, a gate dielectric layer 122 is between the lower word line layer 120a and the word line trench 120T, and the lower word line layer 120a may conformally cover a bottom surface and an inner wall of a partial lower portion of each of the plurality of word line trenches 120T. For example, the upper word line layer 120b may be formed to cover the lower word line layer 120a and to partially fill the lower portion of each of the plurality of word line trenches 120T.

In some embodiments, before or after the plurality of word lines 120 are formed, impurity ions are injected into the plurality of active regions 118 of the substrate 110 on opposite sides of the plurality of word lines 120 to form source regions and drain regions in the plurality of active regions 118.

The plurality of buried insulating layers 124 may be formed to partially fill upper portions of the plurality of word line trenches 120T. The plurality of buried insulating layers 124 may be formed such that upper surfaces of the plurality of buried insulating layers 124 are at substantially the same vertical level as an upper surface of the substrate 110.

First and second insulating layer patterns 112 and 114 may be formed to cover the device isolation layer 116 and a plurality of active regions 118. For example, the insulating layer patterns 112 and 114 may be formed of silicon oxide, silicon nitride, silicon oxynitride, a metal-based dielectric material, or a combination thereof. In some embodiments, the first and second insulating layer patterns 112 and 114 may be composed of a stacked structure of a plurality of insulating layers including the first insulating layer pattern 112 and the second insulating layer pattern 114. In some embodiments, the first insulating layer pattern 112 may be formed of silicon oxide, and the second insulating layer pattern 114 may be formed of silicon oxynitride. In some other embodiments, the first insulating layer pattern 112 may be formed of a non-metal-based dielectric material, and the second insulating layer pattern 114 may be formed of a metal-based dielectric material. In some embodiments, the second insulating layer pattern 114 may be formed to be thicker than the first insulating layer pattern 112. For example, the first insulating layer pattern 112 may be formed to have a thickness between about 50 Å and about 90 Å, and the second insulating layer pattern 114 may be formed to have a thickness between about 60 Å and about 100 Å, which is thicker than the first insulating layer pattern 112.

Thereafter, after a conductive semiconductor layer is formed on the first and second insulating layer patterns 112 and 114, the direct contact hole 134H penetrating the conductive semiconductor layer and the first and second insulating layer patterns 112 and 114 to expose the source region in the active region 118 is formed, and a direct contact conductive layer filling the direct contact hole 134H is formed. In some embodiments, the direct contact hole 134H may extend into the source region of the active region 118. The conductive semiconductor layer may be formed of, for example, doped polysilicon. The direct contact conductive layer may be formed of, for example, doped polysilicon. In some embodiments, the direct contact conductive layer may be composed of an epitaxial silicon layer.

A metal-based conductive layer for forming a bit line structure 140 and an insulating capping layer may be sequentially formed on the conductive semiconductor layer and the direct contact conductive layer. In some embodiments, the metal-based conductive layer may have a stacked structure of a first metal-based conductive layer and a second metal-based conductive layer. A plurality of bit lines having a stacked structure of line-shaped first and second metal-based conductive patterns 145 and 146 and a plurality of insulating capping lines 148 may be formed by etching the first metal-based conductive layer, the second metal-based conductive layer, and the insulating capping layer.

In some embodiments, the first metal-based conductive pattern 145 may be formed of titanium nitride (TiN) or TSN (Ti—Si—N), and the second metal-based conductive pattern 146 may be formed of tungsten (W) or tungsten silicide (WSix). In some embodiments, the first metal-based conductive pattern 145 may serve as a diffusion barrier. In some embodiments, the plurality of insulating capping lines 148 may be formed of silicon nitride.

One bit line 147 and one insulating capping line 148 covering the one bit line 147 may constitute one bit line structure 140. A plurality of bit line structures 140, each including the bit line 147 and the insulating capping line 148 covering the bit line 147, may extend parallel in a second horizontal direction (Y direction) parallel to a main surface of the substrate 110. The plurality of bit lines 147 may constitute a plurality of bit lines BL as illustrated in FIG. 2. In some embodiments, the bit line structure 140 may further include a conductive semiconductor pattern 132 that is a part of a conductive semiconductor layer between the first and second insulating layer patterns 112 and 114 and the first metal-based conductive pattern 145.

In an etch process of forming the plurality of bit lines 147, a portion of the conductive semiconductor layer, which does not vertically overlap the plurality of bit lines 147, and the direct contact conductive layer may be removed to form a plurality of conductive semiconductor patterns 132 and a plurality of direct contact conductive patterns 134. In this case, the first and second insulating layer patterns 112 and 114 may serve as an etch stop layer in the etch process of forming the plurality of bit lines 147, the plurality of conductive semiconductor patterns 132, and the plurality of direct contact conductive patterns 134. The plurality of bit lines 147 may be formed to be electrically connected to the plurality of active regions 118 through the plurality of direct contact conductive patterns 134.

A plurality of insulating spacer structures 150 may be formed to cover opposite sidewalls of the plurality of bit line structures 140. Each of the plurality of insulating spacer structures 150 may be formed to include a first insulating spacer 152, a second insulating spacer 154, and a third insulating spacer 156. The second insulating spacer 154 may be formed of a material with a lower dielectric constant than dielectric constants of the first insulating spacer 152 and the third insulating spacer 156. In some embodiments, the first insulating spacer 152 and the third insulating spacer 156 may be formed of nitride (e.g., silicon nitride), and the second insulating spacer 154 may be formed of oxide (e.g., silicon oxide). In some embodiments, the first insulating spacer 152 and the third insulating spacer 156 are formed of nitride (e.g., silicon nitride), and the second insulating spacer 154 may be formed of a material with etch selectivity with respect to the first insulating spacer 152 and the third insulating spacer 156. For example, when the first insulating spacer 152 and the third insulating spacer 156 are formed of nitride (e.g., silicon nitride), the second insulating spacer 154 may be formed of oxide (e.g., silicon oxide) but may be removed in a subsequent process to be an air spacer. In some embodiments, the plurality of insulating spacer structure 150 may include the second insulating spacer 154 formed of oxide (e.g., silicon oxide) and the third insulating spacer 156 formed of nitride (e.g., silicon nitride).

A plurality of insulating fences 180 may be formed in spaces between the plurality of insulating spacer structures 150 covering opposite sidewalls of the plurality of bit line structures 140. The plurality of insulating fences 180 may be arranged in a row to be separated from each other between pairs of insulating spacer structures 150 facing each other among the plurality of insulating spacer structures 150 covering opposite sidewalls of the plurality of bit line structures 140. In some embodiments, a pair of insulating spacer structures 150 may be spaced apart from each other in the second horizontal direction (the Y direction) with one of the plurality bit line structures therebetween. For example, the plurality of insulating fences 180 may be formed of nitride (e.g., silicon nitride).

In some embodiments, the plurality of insulating fences 180 may be formed to penetrate the first and second insulating layer patterns 112 and 114 and extend into the buried insulating layers 124 but are not limited thereto. In some embodiments, the plurality of insulating fences 180 may penetrate the first and second insulating layer patterns 112 and 114 without extending into the plurality of buried insulating layers 124, may extend into the first and second insulating layer patterns 112 and 114 without penetrating the first and second insulating layer patterns 112 and 114, or may not extend into the first and second insulating layer patterns 112 and 114 such that lower surfaces of the plurality of insulating fences 180 may be in contact with the first and second insulating layer patterns 112 and 114.

A plurality of buried contact holes 170H may be defined between the plurality of bit lines 147 and between the plurality of insulating fences 180. The plurality of buried contact holes 170H and the plurality of insulating fences 180 may be alternately arranged between the pair of insulating spacer structures 150 facing, in the second horizontal direction (the Y direction), each other among the plurality of insulating spacer structures 150 covering both sidewalls of the plurality of bit line structures 140. An inner space of each of the plurality of buried contact holes 170H may be defined by the insulating spacer structure 150 covering sidewalls of each of corresponding two adjacent bit lines 147, corresponding two insulating fences of the plurality of insulating fences 180, and the active region 118 between the two adjacent bit lines 147 of the plurality of bit lines 147.

The plurality of buried contact holes 170H may be formed by removing the first and second insulating layer patterns 112 and 114 and a part of each of the plurality of active regions 118 by using, as masks, the plurality of insulating capping lines 148, the plurality of insulating spacer structures 150 covering opposite sidewalls of the plurality of bit line structures 140, and the plurality of insulating fences 180. In some embodiments, the plurality of buried contact holes 170H may be formed to expand spaces defined by the plurality of active regions 118 by first performing an anisotropic etch process of removing some parts of the first and second insulating layer patterns 112 and 114 and the plurality of active regions 118 by using the plurality of insulating capping lines 148, the plurality of insulating spacer structures 150 covering opposite sidewalls of the plurality of bit line structures 140, and the plurality of insulating fences 180 as etch masks, and then by performing an isotropic etch process of further removing other parts of the plurality of active regions 118 so that the plurality of buried contact holes 170H laterally expand.

Referring to FIGS. 6A to 6D, a plurality of buried contacts 170 are formed in the plurality of buried contact holes 170H. The plurality of buried contact holes 170H and the plurality of insulating fences 180 may be alternately arranged between the pair of insulating spacer structures 150 facing, in the second horizontal direction (the Y direction), each other among the plurality of insulating spacer structures 150 covering opposite sidewalls of the plurality of bit line structures 140. For example, the plurality of buried contacts 170 may be formed of polysilicon (e.g., doped polysilicon).

In some embodiments, the plurality of buried contacts 170 may be arranged in a line in each of a first horizontal direction (the X direction) and a second horizontal direction (the Y direction). Each of the plurality of buried contacts 170 may extend from an upper portion of each of the plurality of active regions 118 in a vertical direction (the Z direction) perpendicular to the substrate 110. The plurality of buried contacts 170 may constitute the plurality of buried contacts BC as illustrated in FIG. 2.

The plurality of buried contacts 170 may be surrounded by a plurality of insulating fences 180 and a plurality of insulating spacer structures 150 covering opposite sidewalls of the plurality of bit line structures 140. The plurality of buried contacts 170 may be disposed in the plurality of buried contact holes 170H, respectively. The plurality of buried contacts 170 may fill lower portions of spaces between the plurality of insulating fences 180 and spaces between the plurality of insulating spacer structures 150 covering both sidewalls of the plurality of bit line structures 140. For example, each of the plurality of buried contacts 170 may be disposed between corresponding two adjacent insulating fences of the plurality of insulating fences 180, and between corresponding two adjacent bit line structures of the plurality of bit line structures 140 with two insulating spacer structures on facing inner sidewalls of the two adjacent bit line structures.

Levels of upper surfaces of the plurality of buried contacts 170 may be lower than levels of upper surfaces of the plurality of insulating capping lines 148. Upper surfaces of the plurality of insulating fences 180 and the upper surfaces of the plurality of insulating capping lines 148 may be at the same vertical level with respect to a vertical direction (the Z direction). For example, the upper surfaces of the plurality of insulating fences 180 and the upper surfaces of the plurality of insulating capping lines 148 may be coplanar.

A plurality of landing pad holes 190H may be defined by the plurality of buried contacts 170, the plurality of insulating spacer structures 150, and the plurality of insulating fences 180. The plurality of buried contacts 170 may be exposed at bottom surfaces of the plurality of landing pad holes 190H.

In a process of forming the plurality of buried contacts 170, upper portions of the plurality of insulating capping line 148 included in the plurality of bit line structures 140 and upper portions of the plurality of insulating spacer structures 150 are partially removed to lower the levels of the upper surface of the plurality of bit line structures 140.

Referring to FIGS. 7A to 7D, recess portions 190R may be formed by forming a landing pad material layer covering the plurality of bit line structures 140 and filling the plurality of landing pad holes 190H, and partially removing the landing pad material layer to form the recess portions 190R. The recess portions 190R may separate the landing pad material layer into a plurality of landing pads 190. The plurality of landing pads 190 may fill at least a part of the plurality of landing pad holes 190H and extend onto the plurality of bit line structures 140.

In some embodiments, the landing pad material layer may include or may be formed of a conductive barrier layer and a conductive pad material layer on the conductive barrier layer. For example, the conductive barrier layer may be formed of metal, conductive metal nitride, or a combination thereof. In some embodiments, the conductive barrier layer may have or may be formed of a Ti/TiN stacked structure. In some embodiments, the conductive pad material layer may include or may be formed of tungsten (W).

In some embodiments, a metal silicide layer may be formed on the plurality of buried contacts 170 before the landing pad material layer is formed. The metal silicide layer may be between the plurality of buried contacts 170 and the landing pad material layer. The metal silicide layer may be formed of cobalt silicide ($CoSi_x$), nickel silicide ($NiSi_x$), or manganese silicide ($MnSi_x$) but is not limited thereto.

The plurality of landing pads 190 may be separated from each other with the recess portions 190R therebetween. The plurality of landing pads 190 may be arranged on the plurality of buried contacts 170 and extend over the plurality of bit line structures 140. In some embodiments, the plurality of landing pads 190 may extend over the plurality of bit lines 147. The plurality of landing pads 190 may be arranged on the plurality of buried contacts 170, and the plurality of buried contacts 170 and the plurality of landing pads 190 may be electrically connected with each other, respectively. The plurality of landing pads 190 may be connected to the plurality of active regions 118 through the plurality of buried contacts 170, respectively.

The recess portions 190R may be filled respectively with insulating structures 195. In some embodiments, the insulating structures 195 may each include an interlayer insulating layer and an etch stop layer. For example, the interlayer insulating layer may be formed of oxide (e.g., silicon oxide), and the etch stop layer may be formed of nitride (e.g., silicon nitride). FIGS. 7A and 7C illustrate that upper surfaces of the insulating structures 195 and upper surfaces of the plurality of landing pads 190 are at the same vertical level or may be coplanar, but are not limited thereto. For example, the insulating structures 195 may have upper surfaces at a vertical level higher than the upper surface of the plurality of landing pads 190 by filling the recess portions 190R and covering the upper surfaces of the plurality of landing pads 190.

FIGS. 8A to 8I illustrates partial upper portions of the plurality of landing pads 190 and the plurality of insulating structures 195 as illustrated in FIGS. 7A to 7D without illustrating lower portions thereof, but descriptions of FIGS. 8A to 8I may be made with reference to FIGS. 7A to 7D. In FIGS. 8A to 8I, a memory cell region CR may correspond to line C-C' of FIG. 2. FIG. 8J is an enlarged cross-sectional view of a portion AX of FIG. 8I.

Referring to FIG. 8A, an etch stop layer 300, a first mold layer MD1, a first support pattern 310, a second mold layer MD2, a second support pattern 320, a mask semiconductor material layer SMK, and a third support pattern 330 are sequentially formed on the plurality of landing pads 190 and the insulating structures 195, and then a mask layer MKL may be formed on the third support pattern 330. The first and second mold layers MD1 and MD2 may include or may be formed of materials having etch selectivity with respect to the first support pattern 310, the second support pattern 320, and the third support pattern 330. In some embodiments, each of the first support pattern 310, the second support pattern 320, and the third support pattern 330 may have an opening extending from an upper surface to a lower surface when viewed in a plan view.

The memory cell region CR may be the cell blocks SCB as illustrated in FIG. 1 or the memory cell region CR as illustrated in FIG. 2, and the peripheral region PR may be the peripheral region PR as illustrated in FIG. 1. The plurality of landing pads 190 and the insulating structures 195 may be formed in the memory cell region CR. A plurality of logic bit lines BLP and a logic capping layer BLC covering the plurality of logic bit lines BLP may be formed in the peripheral region PR. In some embodiments, the plurality of logic bit lines BLP may be formed of the same material as the plurality of landing pads 190. Upper surfaces of the plurality of logic bit lines BLP may be at the same vertical level as upper surfaces of the plurality of landing pads 190. In some embodiments, the logic capping layer BLC may be formed of the same material as the etch stop layer 300. In some embodiments, portions of the logic capping layer BLC which fill spaces between the plurality of logic bit lines BLP may be formed of the same material as the insulating structures 195, and portions of the logic capping layer BLC which cover the plurality of logic bit lines BLP may be formed of the same material as the etch stop layer 300.

In some embodiments, each of the first and second mold layers MD1 and MD2 may include or may be formed of a spin-on hard mask (SOH) material or a semiconductor oxide layer. The semiconductor oxide layer may include oxide such as tetra ethyl ortho silicate (TEOS) oxide and high-density plasma (HDP) oxide. The first and second mold layers MD1 and MD2 may be formed of the same material but are not limited thereto and may be formed of different materials. In some embodiments, the first mold layer MD1 may be thicker than the second mold layer MD2.

Each of the first support pattern 310, the second support pattern 320, and the third support pattern 330 may be formed of one of silicon nitride (SiN), silicon carbonitride (SiCN), N-rich silicon nitride (N-rich SiN), and Si-rich silicon nitride film (Si-rich SiN) but is not limited thereto. In some embodiments, the second support pattern 320 may be thicker than the first support pattern 310. In some embodiments, the third support pattern 330 may be thinner than the second support pattern 320.

The mask semiconductor material layer SMK may be formed of a semiconductor material. For example, the mask semiconductor material layer SMK may be formed of silicon. The mask layer MKL may be composed of a photoresist layer, a hard mask material layer, an oxide layer, or a combination thereof.

Referring to FIGS. 8A and 8B, a plurality of preliminary holes PH may be formed by patterning the mask layer MKL in the memory cell region CR and partially removing the third support pattern 330 and the mask semiconductor material layer SMK by using the patterned mask layer MKL as an etch mask. The second support pattern 320 may be exposed on bottom surfaces of the plurality of preliminary holes PH. In some embodiments, the plurality of preliminary holes PH may penetrate the third support pattern 330 and the mask semiconductor material layer SMK but may not penetrate the second support pattern 320.

Referring to FIGS. 8B and 8C, a plurality of electrode holes EH may be formed by partially removing the second mold layer MD2, the first support pattern 310, the first mold layer MD1, and the etch stop layer 300 by using the mask layer MKL having the plurality of preliminary holes PH, the third support pattern 330 and the mask semiconductor material layer SMK as etch masks. The plurality of landing pads 190 may be exposed at bottom surfaces of the plurality of electrode holes EH. The plurality of electrode holes EH may penetrate the third support pattern 330, the mask semiconductor material layer SMK, the second mold layer MD2, the first support pattern 310, the first mold layer MD1, and the etch stop layer 300.

In a process of forming the plurality of electrode holes EH, a part of the mask layer MKL may be consumed, and the mask layer MKL may be removed after the plurality of electrode holes EH are formed.

Referring to FIGS. 8C and 8D, sidewall recesses SRC communicating with the plurality of electrode holes EH may be formed by partially removing the mask semiconductor material layer SMK exposed through the plurality of electrode holes EH. For example, the sidewall recesses SRC may be connected to the plurality of electrode holes EH, respectively. The sidewall recesses SRC may be formed by partially removing sidewalls of the mask semiconductor material layer SMK facing the plurality of electrode holes EH. In some embodiments, the sidewall recesses SRC may not be formed. In some embodiments, the sidewall recesses SRC may be formed by an isotropic etching process.

Referring to FIGS. 8D and 8E, a third mold layer MD3 may be formed by oxidizing at least a part of the mask semiconductor material layer SMK exposed through the plurality of electrode holes EH and the plurality of sidewall recesses SRC. In some embodiments, when the mask semiconductor material layer SMK is formed of silicon, the third mold layer MD3 may be formed of silicon oxide.

In some embodiments, the mask semiconductor material layer SMK may be formed of the third mold layer MD3 but is not limited thereto. In some embodiments, the mask semiconductor material layer SMK may be partially oxidized. For example, a portion of the mask semiconductor material layer SMK which is relatively adjacent to the plurality of electrode holes EH may be oxidized to form the third mold layer MD3, but a portion that is relatively separated from the plurality of electrode holes EH may remain as the mask semiconductor material layer SMK after oxidation. FIG. 8E illustrates that a part of the mask semiconductor material layer SMK remains in the peripheral region PR after the third mold layer MD3 is formed, but FIG. 8E illustrates an example in which a part of the mask semiconductor material layer SMK may remain only in the peripheral region PR. The present invention is not limited thereto. For example, a part of the mask semiconductor material layer SMK may remain in a portion of the memory cell region CR. The oxidized mask semiconductor material layer may be separated from the plurality of electrode holes EH. For example, the oxidized mask semiconductor material may be disposed between the plurality of electrode holes EH and the remaining mask semiconductor material layer.

In some embodiments, the third mold layer MD3 formed by oxidizing the mask semiconductor material layer SMK may include mold protrusions MDP protruding into the plurality of electrode holes EH. The mold protrusions MDP may protrude into the plurality of electrode holes EH beyond sidewalls of each of the second support pattern 320 and the third support pattern 330 exposed in the plurality of electrode holes EH.

In FIG. 8E, the third support pattern 330, the third mold layer MD3, the mask semiconductor material layer SMK, the second support pattern 320, the second mold layer MD2, the first support pattern 310, and the first mold layer MD1 which are formed in the peripheral region PR may be removed in a subsequent process, and thus, only the memory cell region CR is illustrated in FIGS. 8F to 8I, and the peripheral region PR is omitted therein.

Referring to FIG. 8F, the lower electrode material layer 210P may be formed to fill the plurality of electrode holes EH and cover an upper surface of the third support pattern 330. The lower electrode material layer 210P may be formed of silicon doped with impurities, metal such as tungsten and copper, or a conductive metal compound such as titanium nitride. In some embodiments, the lower electrode material layer 210P may be formed of titanium nitride. The lower electrode material layer 210P may include electrode concave portions 210 RC corresponding to the mold protrusions MDP. The electrode concave portions 210 RC may have smaller horizontal widths than widths of portions of the lower electrode material layer 210P in the plurality of electrode holes EH.

Referring to FIGS. 8F and 8G, a plurality of lower electrodes 210 may be formed by partially removing an upper portion of the lower electrode material layer 210P. Each of the plurality of lower electrodes 210 may be electrically connected to a corresponding landing pad of the plurality of landing pads 190. In some embodiments, the plurality of lower electrodes 210 filling the plurality of electrode holes EH may be formed by partially removing the upper portion of the lower electrode material layer 210P to expose the third support pattern 330. In some embodiments, at least a part of the third support pattern 330 may be removed in a process of forming the plurality of lower electrodes 210.

Referring to FIGS. 8G and 8H, a mold removal space MDR may be formed by removing the first mold layer MD1, the second mold layer MD2, and the third mold layer MD3. In some embodiments, a process of removing the first mold layer MD1, the second mold layer MD2, and the third mold layer MD3 may be performed by wet etching. For example, the first mold layer MD1, the second mold layer MD2, and the third mold layer MD3 may be removed through openings formed in each of the first support pattern 310, the second support pattern 320, and the third support pattern 330. The first support pattern 310, the second support pattern 320, and the third support pattern 330 may be in contact with sidewalls of the plurality of lower electrodes 210.

Figure 8J:
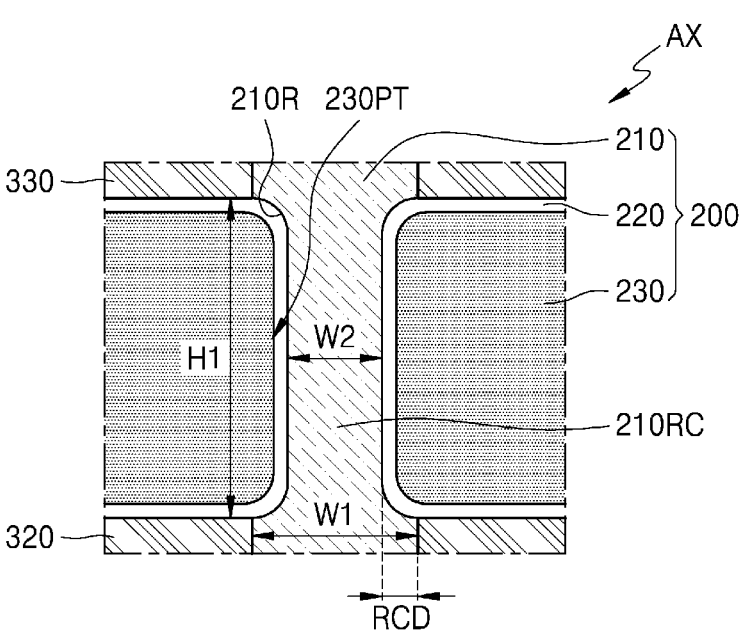

Referring to FIGS. 8H, 8I, and 8J, the plurality of capacitor structures 200 including the plurality of lower electrodes 210, the capacitor dielectric layer 220, and the upper electrode 230 may be formed by forming the plurality of lower electrodes 210, the capacitor dielectric layer 220 covering surfaces of the plurality of lower electrodes 210, the first support pattern 310, the second support pattern 320, and the third support pattern 330, and the upper electrode 230 covering the capacitor dielectric layer 220. The first to third support patterns 310 to 330 may contact the sidewalls of the plurality of lower electrodes 210. The capacitor dielectric layer 220 and the upper electrode 230 may fill the mold removal spaces MDR. The capacitor dielectric layer 220 may conformally cover surfaces of the plurality of lower electrodes 210 and surfaces of the first support pattern 310, the second support pattern 320, and the third support pattern 330.

Each of the plurality of lower electrodes 210 may include a recessed electrode portion 210 RC having a relatively narrower horizontal width compared to other portions. A space of each of the plurality of lower electrodes 210 which defines the recessed electrode portion 210 RC may be referred to as an electrode recess 210R. The electrode concave portion 210 RC may protrude upward from an upper surface of the second support pattern 320. In some embodiments, the electrode concave portion 210 RC may be between the upper surface of the second support pattern 320 and a lower surface of the third support pattern 330. In some embodiments, the electrode recess 210R may have a round corner adjacent to the second support pattern 320 and the third support pattern 330.

A part of the lower electrode 210 surrounded by the second support pattern 320 may have a first horizontal width W1, and the electrode concave portion 210 RC may have a second horizontal width W2. The smallest value of the second horizontal width W2 may be less than the first horizontal width W1. In some embodiments, the smallest value of the second horizontal width W2 may be greater than or equal to a half of the first horizontal width W1. In some embodiments, the first horizontal width W1 may be between several nanometers and several tens of nanometers. For example, the first horizontal width W1 may be between about 10 nm and about 20 nm. The electrode recess 210R may have a recess depth RCD in a horizontal direction. The recess depth RCD may be a difference between the first horizontal width W1 and the second horizontal width W2. In some embodiments, the recess depth RCD may be less than or equal to a half of the first horizontal width W1. In some embodiments, the electrode concave portion 210RC or the electrode recess 210R may have a first height H1. In some embodiments, the first height H1 may be between several tens of nanometers and several hundred nanometers. The first height H1 may be a distance between an upper surface of the second support pattern 320 and a lower surface of the third support pattern 330.

The upper electrode 230 may have a plurality of electrode protrusions 230PT protruding into the electrode recesses 210R, respectively. The plurality of electrode protrusions 230PT may correspond to the electrode concave portions 210 RC of the plurality of lower electrodes 210, respectively. Because portions of the upper electrode 230 higher than an upper surface of the second support pattern 320 include the electrode protrusions 230PT, the electrode protrusions 230PT may protrude toward the electrode concave portions 210 RC of the plurality of lower electrodes 210 rather than the portions of the upper electrode 230 between the first support pattern 310 and the second support pattern 320. The electrode protrusions 230PT may surround sidewalls of the electrode concave portions 210 RC, and the capacitor dielectric layer 220 may be disposed between the electrode protrusions 230PT and the electrode concave portions 210 RC. In some embodiments, the electrode protrusions 230PT may surround entire sidewalls of upper portions of the plurality of lower electrodes 210 (i.e., entire sidewalls of the electrode concave portions 210 RC), and the capacitor dielectric layer 220 may be disposed between the electrode protrusions 230PT and the upper portions of the plurality of lower electrodes 210. The electrode protrusions 230PT may be disposed above the upper surface of the second support pattern 320. In some embodiments, the electrode protrusions 230PT may be between the upper surface of the second support pattern 320 and the lower surface of the third support pattern 330. In some embodiments, the electrode protrusions 230PT may have round corners adjacent to each of the second support pattern 320 and the third support pattern 330. For example, the round corners of the electrode protrusions 230P adjacent to each of the second support pattern 320 and the third support pattern 330 may respectively correspond to the round corners of the electrode concave portions 210 RC adjacent to each of the second support pattern 320 and the third support pattern 330.

The electrode protrusions 230PT may extend into the electrode recesses 210R in a horizontal direction. The electrode protrusions 230PT may extend into the electrode recesses 210R by a difference between the recess depth RCD and a thickness of the capacitor dielectric layer 220. In some embodiments, the thickness of the capacitor dielectric layer 220 may be several nanometers. A vertical height of the electrode protrusions 230PT may be obtained by subtracting a value twice the thickness of the capacitor dielectric layer 220 from the first height H1.

The peripheral circuit region PR illustrated in FIGS. 8A to 8E may be filled with a buried insulating layer corresponding to a level at which there is the plurality of capacitor structures 200. The buried insulating layer may be composed of, for example, an oxide film or an ultralow K (ULK) film. The oxide fill may be one selected from among a borophosphosilicate glass (BPSG) film, a phosphosilicate glass (PSG) film, a borosilicate glass (BSG) film, an un-doped silicate glass (USG) film, a tetra ethyl ortho silicate (TEOS) film, and a high density plasma (HDP) film. The ULK film may be one selected from among an SiOC film and a SiCOH film having an ultralow dielectric constant K between 2.2 and 2.4.

Referring to FIGS. 1 to 8J, the semiconductor memory device 1 according to the inventive concept includes the plurality of lower electrodes 210 filling the plurality of electrode holes EH. The plurality of electrode holes EH may be formed by using a two-step etch process in which the plurality of preliminary holes PH may be formed by performing a first etch process of partially removing the third support pattern 330 and the mask semiconductor material layer SMK, and then a second etch process may be performed to partially remove portions the second mold layer MD2, the first support pattern 310, the first mold layer MD1, and the etch stop layer 300 via the plurality of preliminary holes PH. Therefore, the plurality of electrode holes EH formed through a two-step etch process having a first etch process and a second etch process have greater vertical heights than a plurality of electrode holes formed through a single etch process. Therefore, the semiconductor memory device 1 according to the inventive concept includes the plurality of lower electrodes 210 with relatively high vertical heights, and thus, capacity of a capacitor may be relatively increased. The plurality of lower electrodes 210 respectively have the electrode concave portions 210RC to increase surface areas of the plurality of lower electrodes 210, and thus, the capacity of a capacitor may be further increased.

FIGS. 9A and 9B are cross-sectional views illustrating a method of fabricating a semiconductor memory device, according to an embodiment.

Referring to FIGS. 8D and 9A, a third mold layer MD3a may be formed by oxidizing at least a part of the mask semiconductor material layer SMK exposed through the plurality of electrode holes EH. The third mold layer MD3a may not have the mold protrusions MDP of the third mold layer MD3 as illustrated in FIG. 8E.

Referring to FIGS. 9A and 9B and descriptions of FIGS. 8F to 8I, a plurality of lower electrodes 210a are formed, and the first mold layer MD1, the second mold layer MD2, and a third mold layer MD3a are removed, and the capacitor dielectric layer 220 and the upper electrode 230a are sequentially formed to form a plurality of capacitor structures 200a including the plurality of lower electrodes 210a, the capacitor dielectric layer 220, and the upper electrode 230a. The plurality of lower electrodes 210a and the upper electrode 230a may be substantially similar to the plurality of lower electrodes 210 and the upper electrode 230 illustrated in FIGS. 8I and 8J, but the plurality of lower electrodes 210 may not have the electrode concave portions 210 RC, and the upper electrode 230 may not have the electrode protrusions 230PT.

Figure 10:
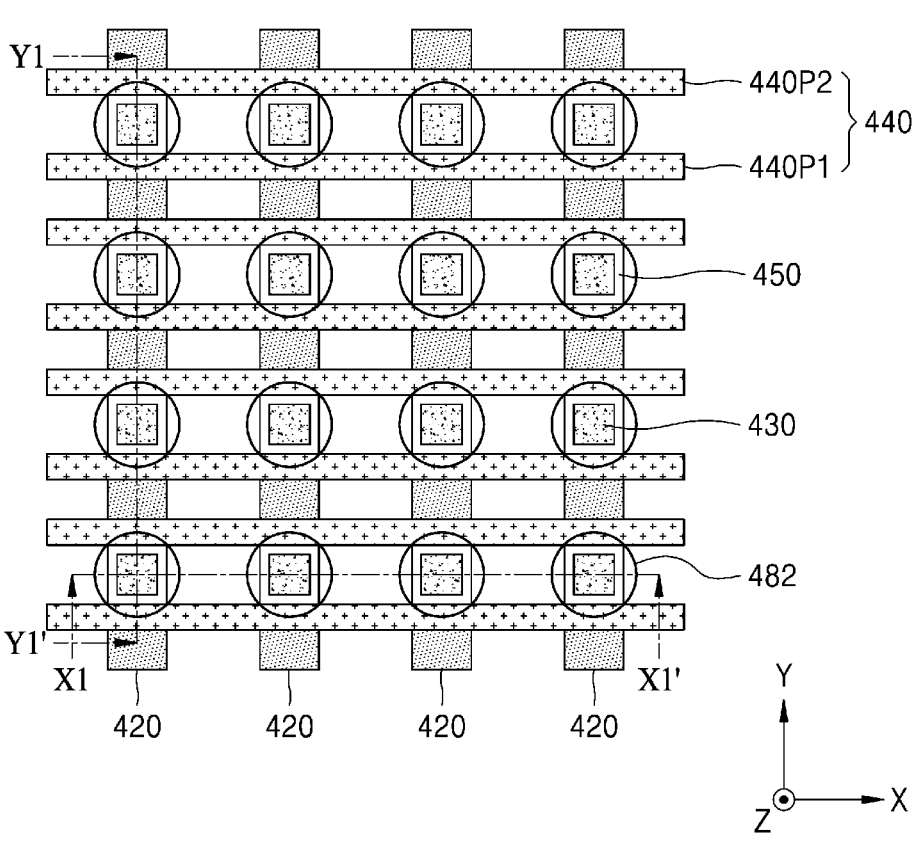
FIG. 10 is a layout diagram illustrating a semiconductor memory device according to an embodiment of the inventive concept.
Figure 11:
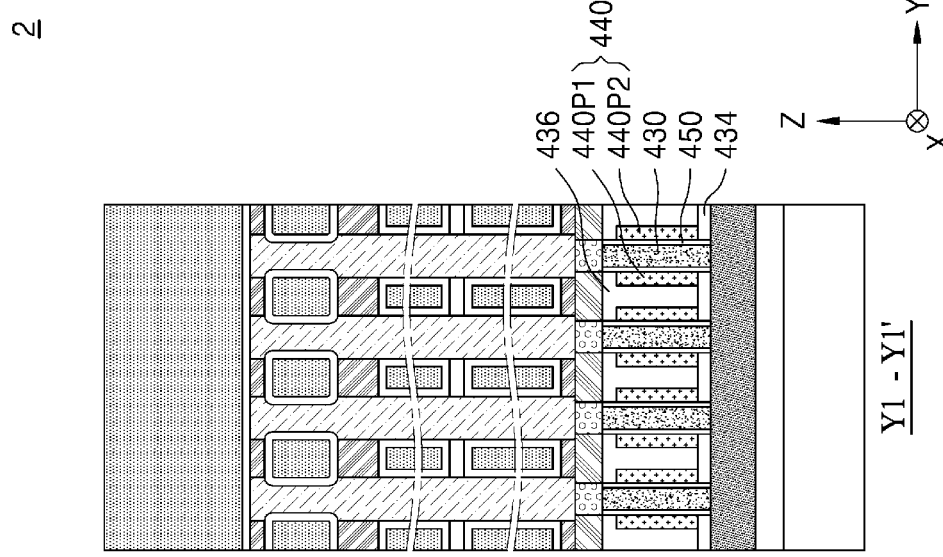
FIG. 11 illustrates cross-sectional views taken along line X1-X1' and line Y1-Y1' of FIG. 10.

FIG. 10 is a layout diagram illustrating a semiconductor memory device according to an embodiment of the inventive concept, and FIG. 11 illustrates cross-sectional views taken along line X1-X1' and line Y1-Y1' of FIG. 10.

Referring to FIGS. 10 and 11, a semiconductor memory device 2 may include a substrate 410, a plurality of first conductive lines 420, channel layers 430, a gate electrode 440, a gate insulating layer 450, and capacitor structures 480. The semiconductor memory device 2 may include a memory device including vertical channel transistors (VCTs). The vertical channel transistors may each have a structure in which channel lengths of the channel layers 430 extend in a vertical direction from the substrate 410.

A lower insulating layer 412 may be on the substrate 410, and a plurality of first conductive lines 420 may be separated from each other in a first horizontal direction (the X direction) and extend in a second horizontal direction (the Y direction) on the lower insulating layer 412. A plurality of first insulating patterns 422 may be arranged on the lower insulating layer 412 to fill spaces between the plurality of first conductive lines 420. The plurality of first insulating patterns 422 may extend in the second horizontal direction (the Y direction), and upper surfaces of the plurality of first insulating patterns 422 may be at the same vertical level as upper surfaces of the plurality of first conductive lines 420. The plurality of first conductive lines 420 may function as bit lines of the semiconductor memory device 2.

In example embodiments, the plurality of first conductive lines 420 may be formed of doped polysilicon, metal, conductive metal nitride, conductive metal silicide, conductive metal oxide, or a combination thereof. For example, the plurality of first conductive lines 420 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, or a combination thereof but are not limited thereto. The plurality of first conductive lines 420 may be composed of a single layer or multiple layers formed of the materials described above. In example embodiments, the plurality of first conductive lines 420 may be formed of a two-dimensional (2D) semiconductor material, and the 2D semiconductor material may include graphene, carbon nanotube, or a combination thereof.

The channel layers 430 may be arranged in a matrix in which the channel layers 430 are separated from each other in the first horizontal direction (the X direction) and the second horizontal direction (the Y direction) on the plurality of first conductive lines 420. The channel layers 430 may each have a first width in the first horizontal direction (the X direction) and a first height in a third direction (the Z direction), and the first height may be greater than the first width. For example, the first height may be between about 2 times the first width and about 10 times the first width but is not limited thereto. A bottom portion of each of the channel layers 430 may function as a first source/drain region (not illustrated), and an upper portion of each of the channel layers 430 may function as a second source/drain region (not illustrated), and a part of each of the channel layers 430 between the first source/drain region and the second source/drain region may function as a channel region (not illustrated).

In example embodiments, the channel layers 430 may each include or may be formed of an oxide semiconductor, and the oxide semiconductor may include $In_xGa_yZnzO$, $In_xGa_ySizO$, $In_xSn_yZnzO$, $In_xZn_yO$, $Zn_xO$, $Zn_xSn_yO$, $Zn_xO_yN$, $Zr_xZn_ySn_zO$, $Sn_xO$, $Hf_xIn_zO$, $Al_xZn_ySn_zO$, $Yb_x$-$Ga_yZn_zO$, $In_xGa_yO$, or a combination thereof. The channel layers 430 may each include a single layer or multiple layers formed of the oxide semiconductor. In some examples, the channel layers 430 may have a bandgap energy greater than a bandgap energy of silicon. For example, the channel layers 430 may have a bandgap energy between about 1.5 eV and about 5.6 eV. In some embodiments, the channel layers 430 may have a bandgap energy between about 2.0 eV and about 4.0 eV. In some embodiments, the channel layers 430 may be formed of polycrystalline or amorphous but are not limited thereto. In example embodiments, the channel layers 430 may each include a 2D semiconductor material, and the 2D semiconductor material may include graphene, carbon nanotube, or a combination thereof.

The gate electrode 440 may extend in the first horizontal direction (the X direction) on opposite sidewalls of the channel layers 430. The gate electrode 440 may include a first sub-gate electrode 440P1 facing a first sidewall of each of the channel layers 430 and a second sub-gate electrode 440P2 facing a second sidewall opposite to the first sidewall of each of the channel layers 430. The semiconductor memory device 2 may have a dual-gate transistor structure having the first sub-gate electrode 440P1, the second sub-gate electrode 440P2, and one channel layer 430 therebetween. However, the inventive concept is not limited thereto, and a single gate transistor structure may also be implemented by omitting the second sub-gate electrode 440P2 and forming only the first sub-gate electrode 440P1 facing the first sidewall of each of the channel layers 430.

The gate electrode 440 may be formed of doped polysilicon, metal, conductive metal nitride, conductive metal silicide, conductive metal oxide, or a combination thereof. For example, the gate electrode 440 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof but is not limited thereto.

The gate insulating layer 450 may surround sidewalls of the channel layers 430 and may be between the channel layers 430 and the gate electrodes 440. For example, as illustrated in FIGS. 10 and 11, the entire sidewalls of the channel layers 430 may be surrounded by the gate insulating layer 450, and the gate electrode 440 may be in contact with a part of the sidewall of the gate insulating layer 450. In some embodiments, the gate insulating layer 450 may extend in an extension direction (that is, the first horizontal direction (the X direction)) of the gate electrode 440, and only two sidewalls of the channel layer 430 facing the gate electrode 440 may be in contact with the gate insulating layer 450. For example, in a dual-gate transistor structure, a pair of gate insulating layers 450 may be separated from each other, and may be disposed on opposite sidewalls of the channel layer 430. A pair of gate electrodes 440 may be disposed on the pair of gate insulating layers 450, respectively.

In example embodiments, the gate insulating layer 450 may be composed of a silicon oxide film, a silicon oxynitride film, a high-k film having a dielectric constant higher than a dielectric constant of the silicon oxide film, or a combination thereof. The high-k film may be formed of metal oxide or metal oxynitride. For example, the high-k film that may be used as the gate insulating layer 450 may be formed of $HfO_2$, HfSiO, HfSiON, HfTaO, HfTiO, HfZrO, $ZrO_2$, $Al_2O_3$, or a combination thereof but is not limited thereto.

A plurality of second insulating patterns 432 may extend in the second horizontal direction (the Y direction) on the plurality of first insulating patterns 422, and the channel layer 430 may be between two adjacent second insulating patterns 432 among the plurality of second insulating patterns 432. In addition, a first buried layer 434 and a second buried layer 436 may be arranged between two adjacent second insulating patterns 432 in a space between the two adjacent channel layers 430. The first buried layer 434 may be at a bottom portion of the space between the two adjacent channel layers 430, and the second buried layer 436 may fill the rest of the space between the two adjacent channel layers 430 on the first buried layer 434. An upper surface of the second buried layer 436 may be at the same level as (or may be coplanar with) an upper surface of the channel layer 430, and the second buried layer 436 may cover an upper surface of the gate electrode 440. In some embodiments, the plurality of second insulating patterns 432 may be formed of a material layer continuous with the plurality of first insulating patterns 422, or the second buried layer 436 may also be formed of a material layer continuous with the first buried layer 434. In some embodiments, the plurality of second insulating patterns 432 and the plurality of first insulating patterns 422 may be formed of the same material and may be connected with each other. In some embodiments, the second buried layer 436 and the first buried layer 434 may be formed of the same material and may be connected with each other.

Capacitor contacts 460 may be arranged on the channel layer 430. The capacitor contacts 460 may vertically overlap the channel layer 430 and may be arranged in a matrix in which the capacitor contacts 460 are separated from each other in the first horizontal direction (the X direction) and the second horizontal direction (the Y direction). Capacitor contacts 460 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof but are not limited thereto. The upper insulating layer 462 may surround sidewalls of the capacitor contacts 460 on the plurality of second insulating patterns 432 and the second buried layer 436.

An etch stop layer 470 may be on the upper insulating layer 462, and the capacitor structure 480 may be on the etch stop layer 470. The capacitor structure 480 may include lower electrodes 482, a capacitor dielectric layer 484, and an upper electrode 486.

The lower electrodes 482 may penetrate the etch stop layer 470 to be electrically connected to upper surfaces of the capacitor contacts 460. The lower electrodes 482 may be formed in a pillar type extending along a straight line extending in a third direction (the Z direction) but are not limited thereto. In example embodiments, the lower electrodes 482 may vertically overlap the capacitor contacts 460 and may be arranged in a matrix in which the lower electrodes 482 are separated from each other in the first horizontal direction (the X direction) and the second horizontal direction (the Y direction). In some embodiments, landing pads (not illustrated) may be further arranged between the capacitor contacts 460 and the lower electrodes 482, and thus, the lower electrodes 482 may also be arranged in a hexagonal shape.

The lower electrodes 482 may have electrode concave portions 482RC similar to the electrode concave portions 210 RC of the lower electrodes 210 as described with reference to FIGS. 3A to 8J, and the upper electrode 486 may have electrode protrusions 486PT similar to the electrode protrusions 230PT of the upper electrode 230 as described with reference to FIGS. 3A to 8J.

Figure 12:
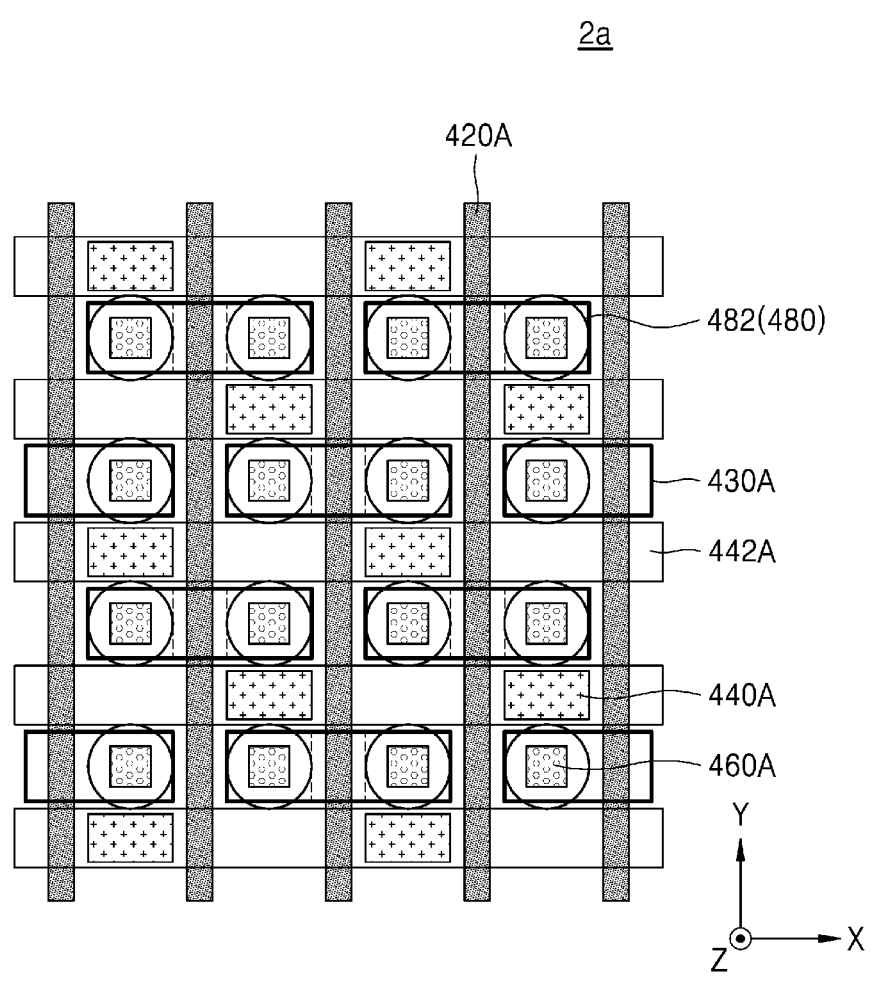
FIG. 12 is a layout diagram illustrating a semiconductor memory device according to an embodiment of the inventive concept.
Figure 13:
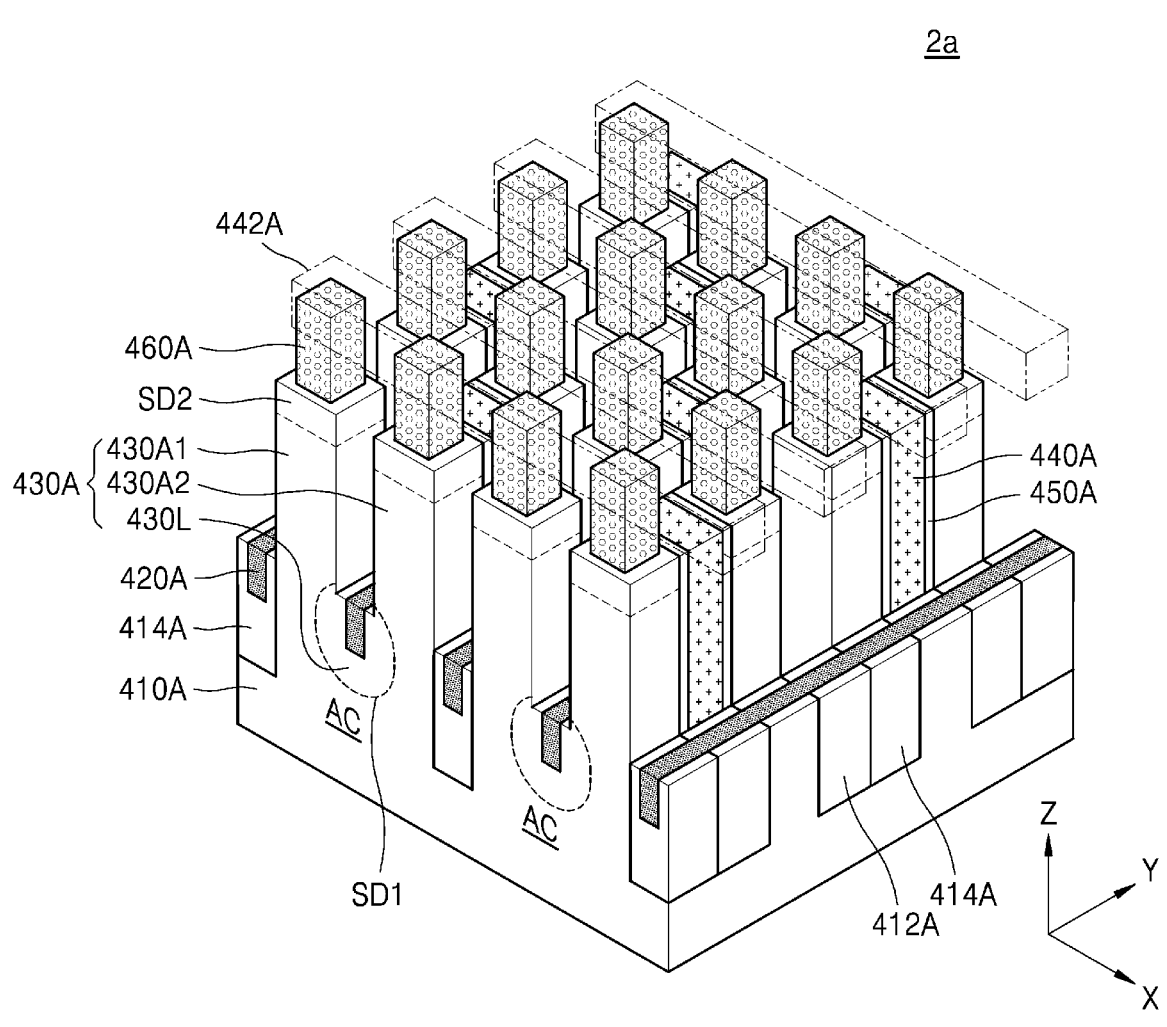
FIG. 13 is a perspective view illustrating a semiconductor memory device.

FIG. 12 is a layout diagram illustrating a semiconductor memory device according to an embodiment of the inventive concept, and FIG. 13 is a perspective view illustrating a semiconductor memory device.

Referring to FIGS. 12 and 13, a semiconductor memory device 2a may include a substrate 410A, a plurality of first conductive lines 420A, channel structures 430A, contact gate electrodes 440A, a plurality of second conductive lines 442A, and capacitor structures 480. The semiconductor memory device 2a may include a memory device including vertical channel transistors (VCTs).

A plurality of active regions AC may be defined in the substrate 410A by a first device isolation layer 412A and a second device isolation layer 414A. The channel structures 430A may be respectively arranged in the plurality of active regions AC, and each of the channel structures 430A may include first and second active pillars 430A1 and 430A2 extending in a vertical direction and a connection portion 430L connected to a bottom portion of the active pillar 430A1 and a bottom portion of the second active pillar 430A2. A first source/drain region SD1 may be in the connection portion 430L, and a second source/drain region SD2 may be on each of upper portions of the first and second active pillars 430A1 and 230A2. The first and second active pillars 430A1 and 430A2 may each constitute an independent unit memory cell.

The plurality of first conductive lines 420A may extend in a direction crossing the plurality of active regions AC, for example, in a second horizontal direction (the Y direction). The plurality of first conductive lines 420A may each be on the connection portion 430L between the first and second active pillars 430A1 and 430A2 and may each be on the first source/drain region SD1. The plurality of first conductive lines 420A may each be between the two channel structures 430A. The plurality of first conductive lines 420A may each function as a common bit line included in two unit memory cells composed of the first and second active pillars 430A1 and 430A2 arranged on opposite sides of each of the plurality of first conductive lines 420A.

The contact gate electrodes 440A may each be between two adjacent channel structures 430A in the second horizontal direction (the Y direction). For example, the contact gate electrodes 440A may each be between the first and second adjacent active pillars 430A1 and 430A2 included in each of the channel structures 430A and may be shared by the first active pillar 430A1 and the second active pillar 430A2 arranged on opposite sidewalls of the contact gate electrode 440A. Gate insulating layers 450A may be between the contact gate electrode 440A and the first active pillar 430A1 and between the contact gate electrode 440A and the second active pillar 430A2. The plurality of second conductive lines 442A may extend in the first horizontal direction (the X direction) on upper surfaces of the contact gate electrodes 440A. The plurality of second conductive lines 442A may be connected to the gate electrodes 440. The plurality of second conductive lines 442A or connected structures of the plurality of second conductive lines 442A and the gate electrodes 440 may function as word lines of the semiconductor memory device 2a.

Capacitor contacts 460A may be arranged on the channel structures 430A. The capacitor contacts 460A may be on the second source/drain region SD2, and the capacitor structure 480 may be on the capacitor contact 460A.

The capacitor structure 480 may include the capacitor structures 200 and 200a as described with reference to FIGS. 1 to 9B, and the capacitor structure 480 may include the lower electrode 210 and the upper electrode 230 as illustrated in FIGS. 3A to 8B or may include the lower electrode 210a and the upper electrode 230a as illustrated in FIGS. 9A and 9B.

While the inventive concept has been particularly shown and described with reference to embodiments thereof, it will be understood that various changes in form and details may be made therein without departing from the spirit and scope of the following claims.

What is claimed is:

1. A semiconductor memory device comprising:
a substrate including a memory cell region;
a plurality of capacitor structures arranged in the memory cell region of the substrate and including a plurality of lower electrodes, a capacitor dielectric layer, and an upper electrode;
a first support pattern contacting sidewalls of the plurality of lower electrodes of the plurality of capacitor structures to support the plurality of lower electrodes;
a second support pattern located at a vertical level higher than a vertical level of the first support pattern and contacting the sidewalls of the plurality of lower electrodes to support the plurality of lower electrodes; and
a third support pattern contacting the sidewalls of the plurality of lower electrodes,
wherein the third support pattern is located at a vertical level higher than the vertical level of the second support pattern,
wherein the plurality of lower electrodes have a plurality of recessed electrode portions, respectively, in upper portions of the plurality of lower electrodes,
wherein each recessed electrode portion of the plurality of recessed electrode portions has a first height which is the same as a vertical distance between an upper surface of the second support pattern and a lower surface of the third support pattern, and
wherein the upper electrode has a plurality of electrode protrusions protruding into a plurality of electrode recesses defined by the plurality of recessed electrode portions, respectively.

2. The semiconductor memory device of claim 1,
wherein each of the plurality of recessed electrode portions protrudes upward beyond the upper surface of the second support pattern.

3. The semiconductor memory device of claim 1,
wherein each of the plurality of recessed electrode portions is disposed between the upper surface of the second support pattern and the lower surface of the third support pattern.

4. The semiconductor memory device of claim 1,
wherein an upper surface of the third support pattern is at the same vertical level as uppermost ends of the plurality of lower electrodes.

5. The semiconductor memory device of claim 1, wherein the vertical level of the second support pattern is lower than uppermost ends of the plurality of lower electrodes and higher than middles of the plurality of lower electrodes in a vertical direction perpendicular to an upper surface of the substrate.

6. The semiconductor memory device of claim 1, wherein in each lower electrode of the plurality of lower electrodes, a first horizontal width of a recessed electrode portion is less than a second horizontal width of a portion, surrounded by the second support pattern, of each lower electrode.

7. The semiconductor memory device of claim 6, wherein the first horizontal width is less than the second horizontal width and greater than or equal to a half of the second horizontal width.

8. The semiconductor memory device of claim 1, wherein an upper portion of each of the plurality of lower electrodes is surrounded by a corresponding electrode recess of the plurality of electrode recesses and a corresponding electrode protrusion of the plurality of electrode protrusions.

9. The semiconductor memory device of claim 1, wherein each recessed electrode portion of the plurality of recessed electrode portions includes opposing side surfaces extending in a vertical direction perpendicular to an upper surface of the substrate and spaced apart from each other in a horizontal direction parallel to the upper surface of the substrate, and wherein each side surface of the opposing side surfaces includes an upper round corner and a lower round corner spaced apart from each other in the vertical direction.

10. A semiconductor memory device comprising:
a substrate having a memory cell region;
a plurality of capacitor structures arranged in the memory cell region of the substrate and including a plurality of lower electrodes, an upper electrode, and a capacitor dielectric layer between each of the plurality of lower electrodes and the upper electrode;
a first support pattern contacting sidewalls of the plurality of lower electrodes of the plurality of capacitor structures to support the plurality of lower electrodes;
a second support pattern contacting the sidewalls of the plurality of lower electrodes to support the plurality of lower electrodes, wherein the second support pattern is located over the first support pattern, and located at a vertical level that is lower than uppermost ends of the plurality of lower electrodes and higher than middles of the plurality of lower electrodes in a vertical direction; and
a third support pattern contacting the sidewalls of the plurality of lower electrodes and having an upper surface located at the same vertical level as the uppermost ends of the plurality of lower electrodes, wherein each of the plurality of lower electrodes includes a recessed electrode portion protruding upward from an upper surface of the second support pattern and extending to a lower surface of the third support pattern, and wherein the upper electrode surrounds the recessed electrode portion of each of the plurality of lower electrodes and includes an electrode protrusion extending toward the recessed electrode portion.

11. The semiconductor memory device of claim 10, wherein the capacitor dielectric layer is between the electrode protrusion and the recessed electrode portion, and wherein the electrode protrusion protrudes into an electrode recess defined by the recessed electrode portion.

12. The semiconductor memory device of claim 10, further comprising:
wherein in each lower electrode of the plurality of lower electrodes, the recessed electrode portion is located between the upper surface of the second support pattern and the lower surface of the third support pattern.

13. The semiconductor memory device of claim 12, wherein the recessed electrode portion has round corners adjacent to the second support pattern and the third support pattern.

14. The semiconductor memory device of claim 13, wherein the electrode protrusion has round corners adjacent to the second support pattern and the third support pattern.

15. The semiconductor memory device of claim 14, wherein the electrode protrusion of the upper electrode surrounds a periphery of the recessed electrode portion between the upper surface of the second support pattern and the lower surface of the third support pattern.

16. A semiconductor memory device comprising:
a substrate including a plurality of active regions arranged in a memory cell region;
a plurality of buried contacts connected to the plurality of active regions;
a plurality of landing pads arranged on the plurality of buried contacts;
a plurality of capacitor structures arranged in the memory cell region of the substrate and including a plurality of lower electrodes electrically connected to the plurality of landing pads, an upper electrode, and a capacitor dielectric layer located between each of the plurality of lower electrodes and the upper electrode;
a first support pattern contacting sidewalls of the plurality of lower electrodes of the plurality of capacitor structures to support the plurality of lower electrodes;
a second support pattern contacting the sidewalls of the plurality of lower electrodes to support the plurality of lower electrodes, wherein the second support pattern is located over the first support pattern, and located at a vertical level that is lower than uppermost ends of the plurality of lower electrodes and higher than middles of the plurality of lower electrodes in a vertical direction; and
a third support pattern contacting the sidewalls of the plurality of lower electrodes and being located over the second support pattern, wherein each of the plurality of lower electrodes has a recessed electrode portion located between an upper surface of the second support pattern and a lower surface of the third support pattern, wherein the recessed electrode portion is connected to the upper surface of the second support pattern and the lower surface of the third support pattern, and wherein the upper electrode includes an electrode protrusion extending toward the recessed electrode portion of each of the plurality of lower electrodes.

17. The semiconductor memory device of claim 16, wherein in each lower electrode of the plurality of lower electrodes, a first horizontal width of the recessed electrode portion is less than a second horizontal width of a portion, surrounded by the second support pattern, of each lower electrode.

18. The semiconductor memory device of claim 16, wherein the electrode protrusion surrounds a periphery of the recessed electrode portion between the upper surface of the second support pattern and the lower surface of the third support pattern, and wherein corners of the electrode protrusion are adjacent to the second support pattern and the third support pattern and have round shapes.

* * * * *